(12) United States Patent
Augenbraun et al.

(10) Patent No.: US 7,819,114 B2
(45) Date of Patent: Oct. 26, 2010

(54) PLUG AND PLAY SOLAR PANEL ASSEMBLY

(75) Inventors: Joseph E Augenbraun, Foster City, CA (US); John K Cammack, Palo Alto, CA (US); Darrell S Park, South Pasadena, CA (US)

(73) Assignee: Solar Red Systems, Inc., Sunnyvale, CA (US)

( * ) Notice: Subject to any disclaimer, the term of this patent is extended or adjusted under 35 U.S.C. 154(b) by 0 days.

(21) Appl. No.: 12/477,850

(22) Filed: Jun. 3, 2009

(65) Prior Publication Data

US 2009/0293864 A1 Dec. 3, 2009

Related U.S. Application Data

(60) Provisional application No. 61/195,257, filed on Oct. 3, 2008, provisional application No. 61/058,472, filed on Jun. 3, 2008.

(51) Int. Cl.
*F24J 2/46* (2006.01)
*H02N 6/00* (2006.01)

(52) U.S. Cl. ................. 126/623; 126/704; 136/251

(58) Field of Classification Search ........... 403/322.4, 403/83, 110; 126/623, 704; 136/243–265; 52/173.3, 582.1–582.2; 248/222.51, 222.52, 248/220.22, 205.3, 681, 510, 553, 503, 229.1, 248/226.11, 228.3, 231.51, 231.41, 231.61, 248/231.21; 269/167, 196; 292/247–249, 292/56, 222.51–222.52, 220.22, 71, 65–66, 292/83, 95, 109, 86, 118, 256

See application file for complete search history.

(56) References Cited

U.S. PATENT DOCUMENTS

| | | | | |
|---|---|---|---|---|
| 4,582,953 A * | 4/1986 | Nagase et al. | ............... | 136/259 |
| 5,232,518 A * | 8/1993 | Nath et al. | ................... | 136/251 |
| 5,852,841 A * | 12/1998 | Rissik | .......................... | 15/1.7 |
| 6,370,828 B1 * | 4/2002 | Genschorek | ................. | 52/200 |
| 6,622,980 B2 * | 9/2003 | Boucher et al. | ......... | 248/231.51 |
| 6,663,066 B1 * | 12/2003 | Hong | .................... | 248/231.41 |
| 7,226,092 B2 * | 6/2007 | Anzai | ......................... | 292/247 |
| 7,435,134 B2 * | 10/2008 | Lenox | ........................ | 439/567 |
| 7,487,771 B1 * | 2/2009 | Eiffert et al. | ................ | 126/622 |
| 7,624,958 B2 * | 12/2009 | Ropertz et al. | ......... | 248/231.51 |
| 7,634,875 B2 * | 12/2009 | Genschorek | ............... | 52/173.3 |
| 2003/0070368 A1 * | 4/2003 | Shingleton | ................. | 52/173.3 |
| 2004/0149872 A1 * | 8/2004 | Giles et al. | ............ | 248/226.11 |
| 2004/0169119 A1 * | 9/2004 | Crowell et al. | ........... | 248/316.4 |
| 2007/0113837 A1 * | 5/2007 | Liu | .......................... | 126/25 R |
| 2007/0157963 A1 * | 7/2007 | Metten et al. | ............... | 136/251 |
| 2008/0135094 A1 * | 6/2008 | Corrales | ..................... | 136/259 |
| 2008/0257402 A1 * | 10/2008 | Kamp et al. | ................ | 136/251 |
| 2009/0078299 A1 * | 3/2009 | Cinnamon et al. | .......... | 136/244 |
| 2009/0114269 A1 * | 5/2009 | Fletcher et al. | ............. | 136/251 |
| 2009/0114271 A1 * | 5/2009 | Stancel | ...................... | 136/251 |

(Continued)

*Primary Examiner*—Kenneth B Rinehart
*Assistant Examiner*—Daniel A Bernstein
(74) *Attorney, Agent, or Firm*—Carr & Ferrell LLP

(57) ABSTRACT

A plug and play solar panel assembly is disclosed. According to one embodiment, an apparatus comprises a substantially rectangular sheet having a first area configured to fit between a first layer and a second layer of a weatherproof surface. The sheet has a second area configured to protrude from the first layer and the second layer of the weatherproof surface. The second area includes a mounting area to attach one or more solar panels.

52 Claims, 24 Drawing Sheets

U.S. PATENT DOCUMENTS

2009/0223555 A1* 9/2009 Ammar ................ 136/246
2009/0310312 A1* 12/2009 Wayman et al. .......... 361/709
2010/0043781 A1* 2/2010 Jones et al. ................ 126/704

* cited by examiner

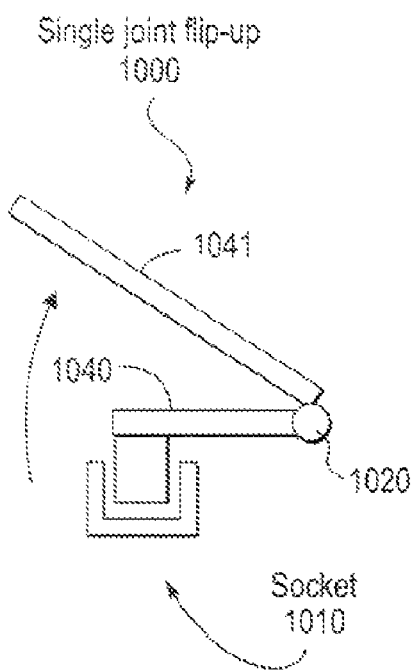
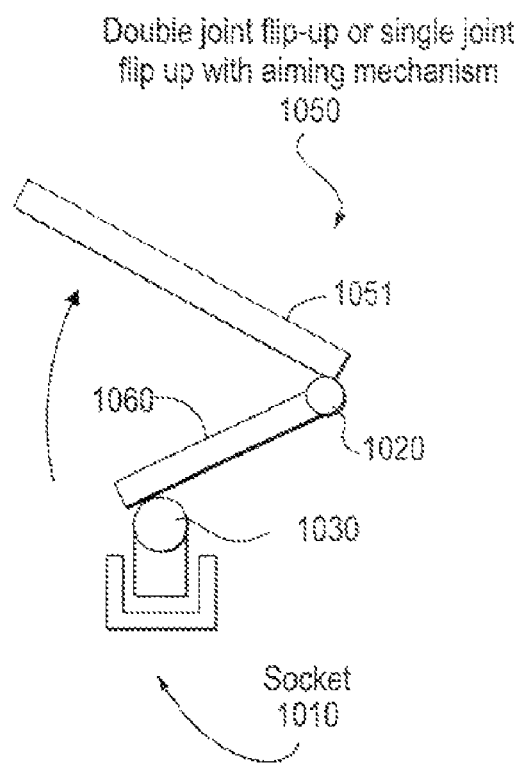
FIG. 10A
FIG. 10B

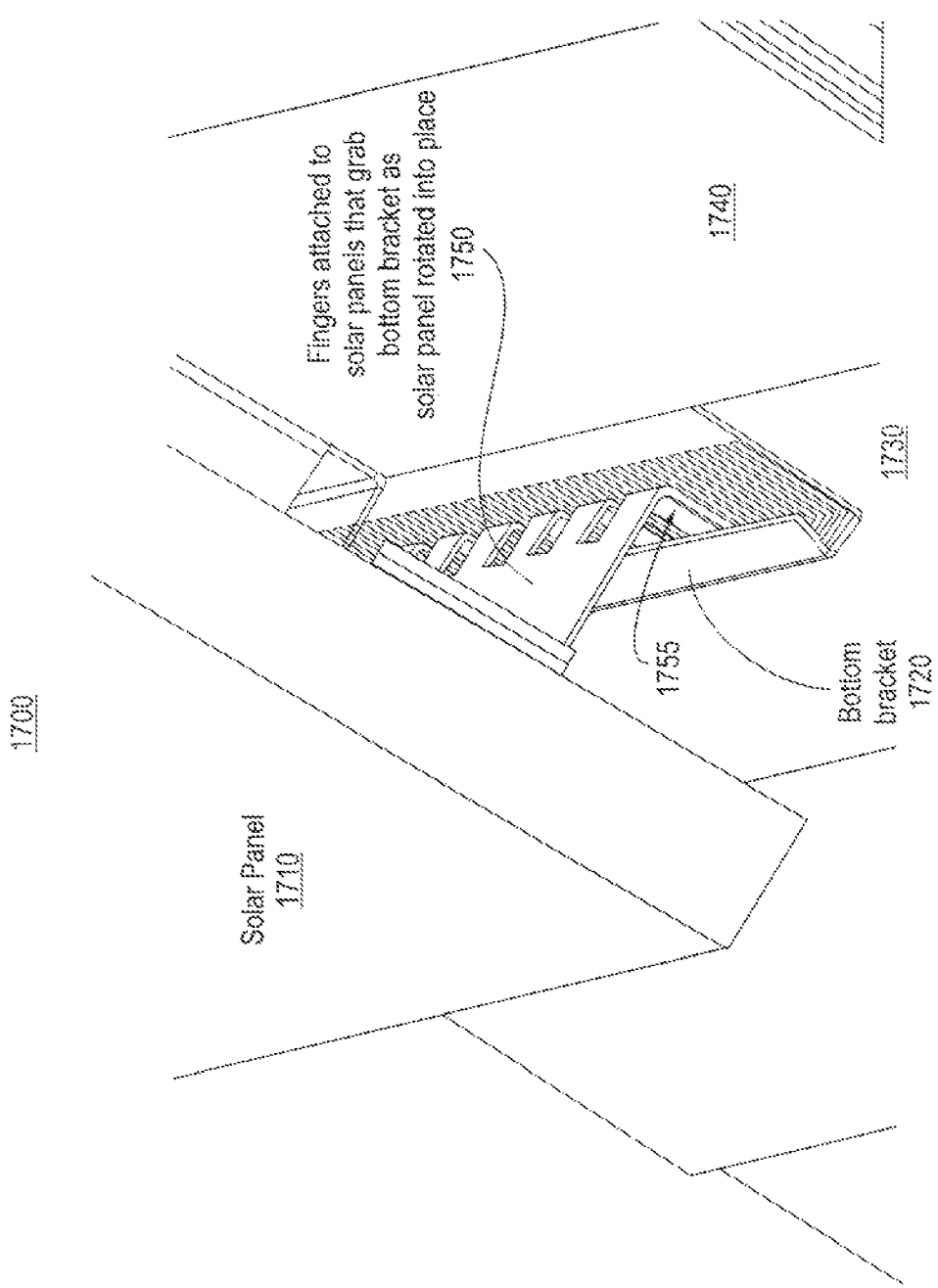

PLUG AND PLAY SOLAR PANEL ASSEMBLY

The present application claims the benefit of and priority to U.S. Provisional Patent Application No. 61/058,472 entitled "Solar Collector Mounting System" and filed on Jun. 3, 2008, and is hereby incorporated by reference in its entirety. The present application also claims the benefit of and priority to U.S. Provisional Patent Application No. 61/195,257 entitled "Solar Energy Collector Mounting System" and filed on Oct. 3, 2008, and is hereby incorporated by reference in its entirety.

FIELD

The present invention relates to the field of solar energy, and in particular to a plug and play solar panel assembly.

BACKGROUND

With global warming concerns and increased energy costs, small solar energy collection systems (such as on residential rooftops) are increasing in popularity. With an increase in volume, costs of the solar collector hardware and silicon have been and will continue to fall. The cost of installation, however, has not been changing dramatically. Prior solar systems also are expensive and difficult to repair, cause roof repairs to be difficult, and are expensive to update for newer technology.

SUMMARY

A plug and play solar panel assembly is disclosed. According to one embodiment, an apparatus comprises a substantially rectangular sheet having a first area configured to fit between a first layer and a second layer of a weatherproof surface. The sheet has a second area configured to protrude from the first layer and the second layer of the weatherproof surface. The second area includes a mounting area to attach one or more solar panels.

The features and advantages described in the specification are not all-inclusive and, in particular, many additional features and advantages will be apparent to one of ordinary skill in the art in view of the drawings and specification. Moreover, it should be noted that the language used in the specification has been principally selected for readability and instructional purposes, and may not have been selected to delineate or circumscribe the inventive subject matter.

BRIEF DESCRIPTION OF THE DRAWINGS

The accompanying drawings, which are included as part of the present specification, illustrate the presently preferred embodiment of the present invention and together with the general description given above and the detailed description of the preferred embodiment given below serve to explain and teach the principles of the present invention.

FIG. 10A illustrates an exemplary flip-up solar collector having one joint, according to one embodiment.

FIG. 10B illustrates an exemplary flip-up solar collector having two joints, according to one embodiment.

FIG. 17 illustrates an exemplary solar panel installation using a lower bracket, according to one embodiment.

DETAILED DESCRIPTION

Figure 1:
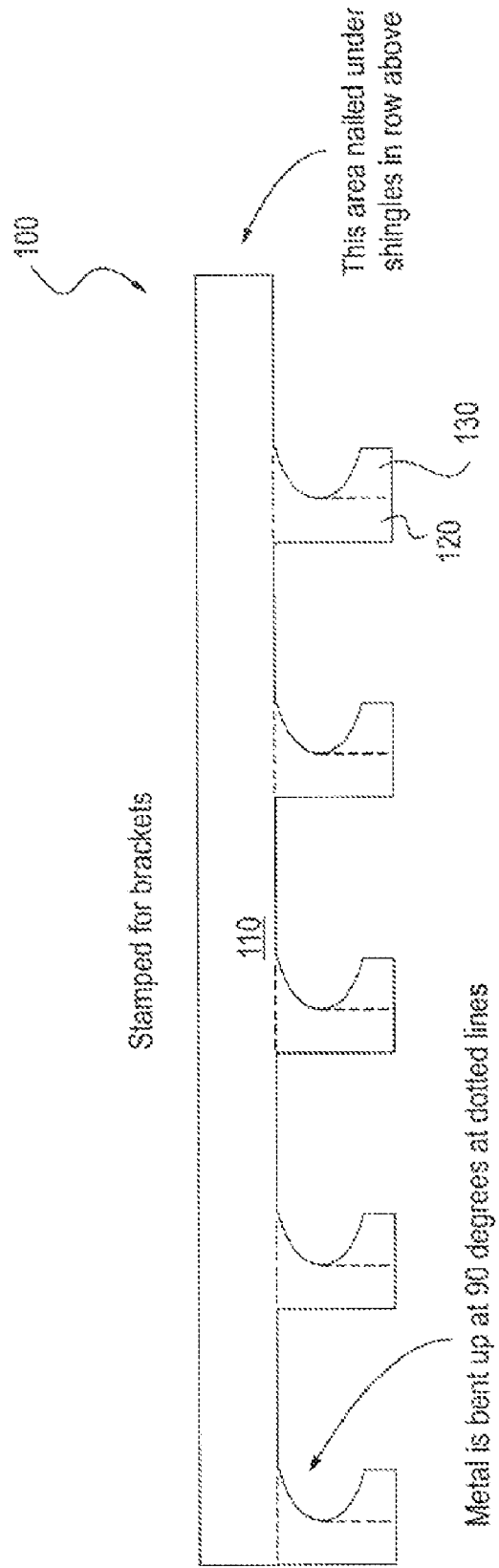
FIG. 1 illustrates an exemplary socket series for solar energy collectors, according to one embodiment.

A plug and play solar panel assembly is disclosed. According to one embodiment, an apparatus comprises a substantially rectangular sheet having a first area configured to fit between a first layer and a second layer of a weatherproof surface. The sheet has a second area configured to protrude from the first layer and the second layer of the weatherproof surface. The second area includes a mounting area to attach one or more solar panels.

Reference in the specification to "one embodiment" or to "an embodiment" means that a particular feature, structure, or characteristic described in connection with the embodiments is included in at least one embodiment. The appearances of the phrase "in one embodiment" in various places in the specification are not necessarily all referring to the same embodiment.

Throughout this specification reference is made to solar photovoltaic collection and solar panels for residential applications. This is done for purposes of clarity of explanation. The present system also applies to commercial, industrial, and utility-scale solar installations, and reference to residential and to photovoltaic is not meant to limit the scope of this application. A solar panel may be any device that collects solar energy and converts it another form of energy (eg. electricity). Furthermore, the brackets described herein are not limited to mounting solar panels, and may also be used for other device including thermal collectors, condensers, wind mills, etc.

Throughout this specification reference is made to roofs. Those skilled in the art will recognize that solar panels may also be mounted on decks, lawns, exterior walls, and other surfaces. The word roof is used in an exemplary manner and is not meant to limit application of the present system to those other situations.

Existing solutions for residential grid-tied photovoltaic power generation is both complicated and expensive. Typically a new installation requires a level of expertise that demands a specialty solar company. The specialty solar company may make several visits to the site, including a site survey, system design, and installation. Installation involves working on the roof and significant electrical work to the home or business's main electrical panel. These firms must charge for their time, resulting in a significant labor cost. In addition, the overall job typically will carry a significant markup, necessitated by the cost of sales, marketing, inventory, etc. incurred by these firms.

The typical installation involves large solar panels. Handling and installing these panels requires a crew of 2 or 3 people and sometimes a crane due to the size, weight, and relative fragility of the panels. The solar panels must be physically mounted to the roof (either on special racks or directly to the roof through brackets), and must be wired together by an electrician. The electrician then wires the panels to an inverter which interfaces the panels to house's electrical service and to the power grid. Once these panels are installed they are intended to remain on the roof for their entire 20 to 30 year life.

No consideration is provided for panel maintenance. If a panel were to be damaged (for example due to a tree branch falling on it), the panel would need to be removed and replaced. Depending on the details of the installation methodology this could involve removing one or more other panels, risking damage to these other panels and incurring large costs. Moreover, the likelihood of being able to purchase a panel that cosmetically and electrically matches the existing panels 10 or 15 years in the future is low.

No consideration is provided for roof maintenance. For example, if the roof under a solar panel starts leaking one or more panels would need to be removed to access the roof underneath. Depending on the details of the installation methodology this could involve removing and replacing a large number of panels, again incurring the risk of damaging these panels while they are handled. Similarly a roof replacement job would require removal and replacement of the solar panels.

Installation brackets for some solar panels create roof penetrations that are sealed with special caulks. These caulks have limited life, incurring a high risk of roof leaks during the panels' 20 to 30 year life.

The economics of residential solar power generation is dependent on not incurring any new costs after the initial installation of a solar photovoltaic system. In fact, any roof maintenance or panel maintenance could require removal and reinstallation of the entire system, incurring a cost which could exceed the cost of a new photovoltaic system, ruining the projected economics of the system.

Panels are not the only available form factor for solar collection systems. Solar shingles are available that are installed with the other shingles on the house. Also available are peel-and-stick solar collectors that cover an individual shingle. These products do not address the aforementioned issues with solar panels, and in fact probably require more installation expertise and are more difficult to maintain than solar panels.

A mounting system for solar collectors is described that includes sockets and/or brackets that accept special photovoltaic solar energy collection modules. The sockets and/or brackets are mounted in a regular or offset grid pattern on the roof, providing mechanical and/or electrical connections for the modules.

The present system allows for a "solar ready" home. This is a home which has installed provisions for mounting the solar collectors and electrically connecting them into the house electrical system. Generation of solar power just requires installing solar collection modules and for some embodiments an inverter and electrical safety hardware. The goal is to make upgrading a house from "solar ready" to solar as easy and inexpensive as possible, ideally only requiring the installation of solar collection modules using no tools or special skills.

In one embodiment, devices that enable installation of solar collectors electrically and/or mechanically are preinstalled on the roof. A socket refers to a device attached to a home that provides a mechanical attachment point for solar collectors and/or an electrical connection point for solar collectors.

Preinstalling a group of sockets onto a home provides the ability to later install solar collectors. The solar collectors may also be easily removed from the sockets for maintenance, roof replacement, etc.

In one embodiment of the present system, the solar collectors interconnect electrically to each other. In one embodiment they interconnect through a cable-and-plug arrangement, where a cable and plug from one connects into a receptacle in the next. In one embodiment they interconnect through connectors that provide automatic interconnection upon installation of adjacent panels.

In one embodiment, a receptacle is installed on the house that allows one solar collector to connect to the house electrical system. For example, a receptacle could be included under the eaves of the roof near some of the brackets for the solar collectors.

In one embodiment, the sockets attach to a bar, rail, slot, ridge, or other linear feature in the solar collector, eliminating the need for exact alignment between the bracket and the solar collector. In one embodiment, the arrangement is reversed, with the bar, rail, slot, ridge or other linear feature as part of the socket.

FIG. 1 illustrates an exemplary socket series for solar energy collectors, according to one embodiment. Socket series 100 automatically spaces solar energy collectors as desired. In one embodiment, socket series 100 provides a horizontal series of sockets that are formed from a single piece of metal. Nail area 110 attaches to a roof underneath roofing shingles using standard roofing nails. Socket series

100 also has support area 120 and support area 130 that are at a predetermined angle relative to nail area 110.

In one embodiment, the sockets are similar to a standard light bulb socket, where the solar collector is screwed into the socket, with integrated electrical connection provided at the bottom of the socket and/or through the screw threads. In one embodiment, the sockets are similar to 3-way light bulb sockets, with multiple electrical connections provided at the bottom of each socket.

In one embodiment, the socket includes an arrangement (for example a protection plate that requires actuation through a slot to push aside) that prevents people from being able to touch the areas of active electricity within the socket.

In one embodiment, the socket includes both legs of a standard residential power line and the neutral.

In one embodiment, electrical connection between the solar collection module and the socket is provided inductively, through a coupled AC or pulsed DC field.

Figure 2:
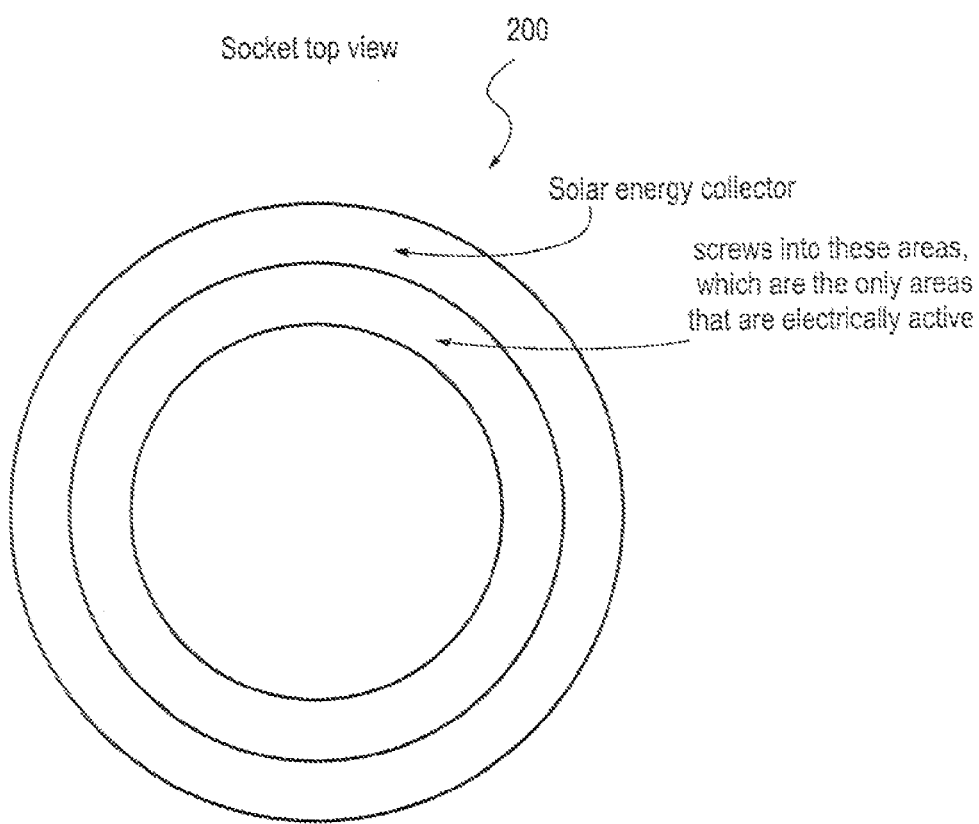
FIG. 2 illustrates a top view of an exemplary socket, according to another embodiment.

FIG. 2 illustrates a top view of an exemplary socket, according to another embodiment. Socket 200 has concentric threaded areas that are electrically active but cannot be touched because the gap needed to reach within the threads is too narrow for a person's finger to fit within the socket 200. This reduces the risk of shock.

In one embodiment, the sockets are manufactured as part of the roof covering system, e.g., as part of the shingles.

In one embodiment, the sockets are separate from the shingles, but are designed to install onto a shingled roof.

Figure 3:
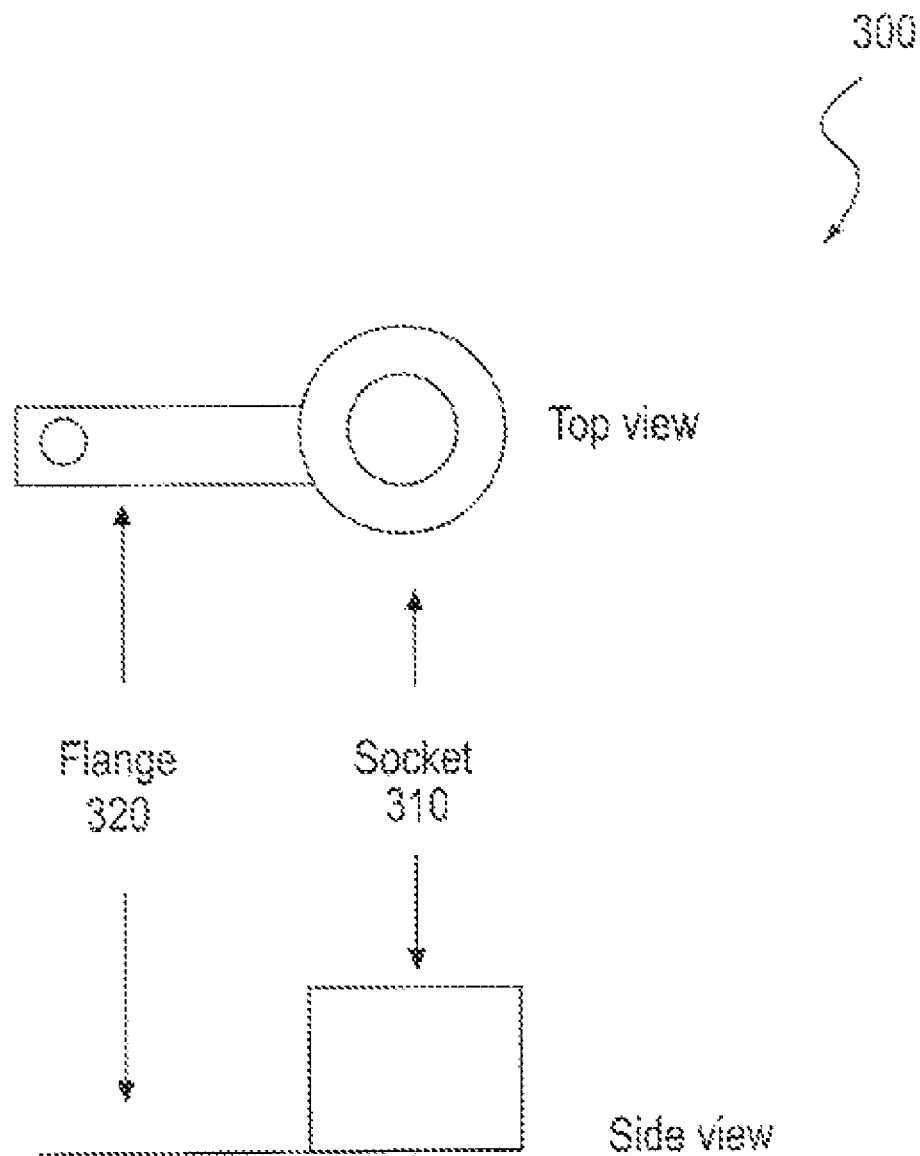
FIG. 3 illustrates an exemplary socket assembly, according to one embodiment.

FIG. 3 illustrates an exemplary socket assembly, according to one embodiment. Socket assembly 300 includes a socket 310 to connect to a solar energy collector panel. Socket assembly 300 also has a mounting flange 320 to connect the socket assembly 300 to a roof.

Those skilled in the art will recognize that many configurations of flanges are possible and that in fact different style roofs (such as Spanish tile or slate) will require a different flange. Those skilled in the art will recognize that sockets without flanges will also be needed in some situations. Throughout this application, reference to "socket assembly" is meant to refer to any configuration of socket with or without any possible flange or other mounting mechanism.

The mounting of the socket assemblies to the roof may include but are not limited to the following techniques:

a. Holes and/or slots in a flange through which the socket assembly is nailed or screwed to the roof
b. A flange that is made of a material (such as asphalt shingle material, plastic, or thin metal) through which a nail or screw may be driven at an arbitrary location. Installation may be performed by directly driving a nail or screw through this flange, or by this flange becoming part of a stack of materials that are captured by a nail or screw driven from a layer that is above the flange (for example driven into a shingle that is overlayed on top of this flange).
c. A flange that has bent edges that act as spikes to hold the socket assembly to the roof.
d. A flange that acts as a clip, for example capturing the edge of a shingle by being appropriately bent.
e. A flange that has bends to conform to the material. For example "Z" flashing is used to waterproof adjacent sheets of T-111 siding. In some applications the same Z profile for the flange may be desirable to allow roof or siding material to lay flat. Another example is roofs with Spanish tile, which will require special shaped flanges.

Embodiments of socket assembly 300 may be used for all forms of roof including but not limited to asphalt shingle, architectural shingle, metal, tar and gravel, rubber membrane, wood shingles and shakes, tile, and slate. The mounting system is adapted to mimic the mounting systems used for other items that attach to the particular kind of roof. In one embodiment, glue-down sockets are available for use on appropriate roofs (for example membrane roofs). In one embodiment, flanges are designed to be embedded in tar and gravel roofs. In one embodiment, a non-permanent weight-based configuration is provided for use on flat roofs or other flat surfaces such as lawns and decks.

In one embodiment, an embodiment of the socket assembly is made for installation into existing roofs. This embodiment allows it to slide under existing shingles and avoid existing nails and/or provide a bend in the sheet metal that helps hold the socket assembly in place.

Figure 4:
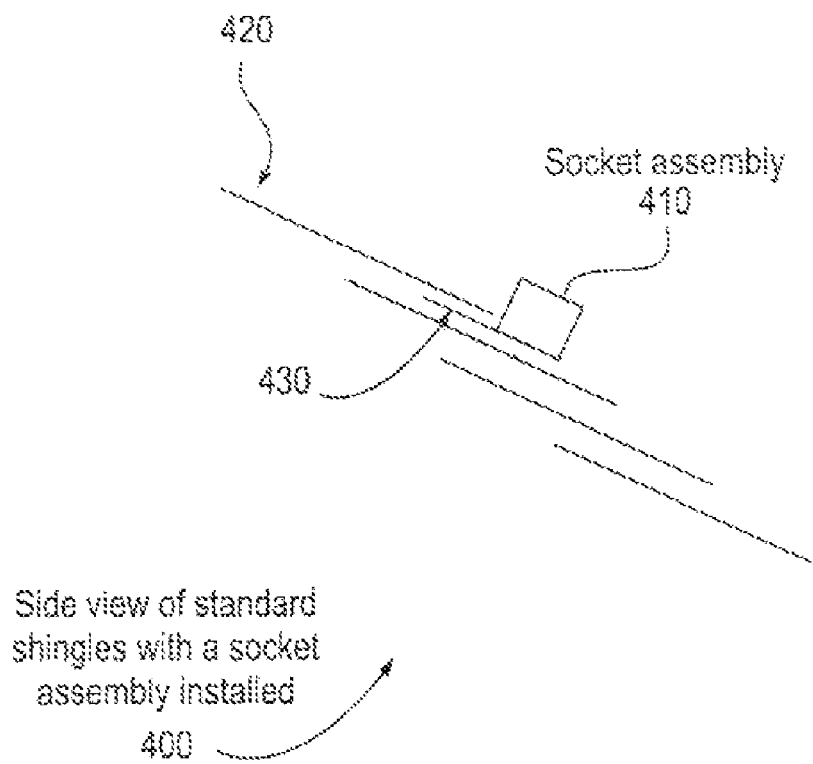
FIG. 4 illustrates an exemplary socket assembly installed into shingle roofs, according to one embodiment.

FIG. 4 illustrates an exemplary socket assembly installed into shingle roofs, according to one embodiment. Socket assembly 400 has flange 430 affixed to the roof (e.g., by screw or nail) without affecting the weather tightness of the roof. The fastener is protected by a shingle.

In one embodiment, socket assemblies are installed in standard outlet boxes.

In one embodiment, socket assemblies are connected to each other using horizontal spacers. In one embodiments, these spacers are an integral part of the group of sockets. For example, the socket assembly may come from the manufacturer as a set of 8 sockets interconnected horizontally by spacers. In one embodiment, the spacers and socket assemblies are separate and are attached to each other in custom configurations in the field.

In one embodiment, the horizontal spacer includes one or more mounting flanges. In one embodiment, a mounting flange is present in every location where a socket is present. In one embodiment, a flange is present in a subset of the locations where sockets are present or in places other than where sockets are present.

In one embodiment, socket assemblies are connected to each other using vertical spacers. In one embodiment, these spacers are an integral part of a group of sockets. For example, the socket assembly may come from the manufacturer as a set of 8 sockets interconnected vertically by spacers. In one embodiment, these spacers are attached to the socket assemblies in the field.

In one embodiment, vertical and/or horizontal spacers have a lowered section on each end to allow one type of spacer to be above the shingles, attaching to other components that are below the shingles or at shingle level.

In one embodiment, socket assemblies are connected to each other using both vertical and/or horizontal spacers. For example, a group of 8 sockets could come as a unit of 4 sockets by 2 sockets that are interconnected both vertically and horizontally. In one embodiment, spacers may be installed in the field both horizontally and vertically, such that any desired arrangement may be realized, for example 4 wide by 2 high.

Figure 5:
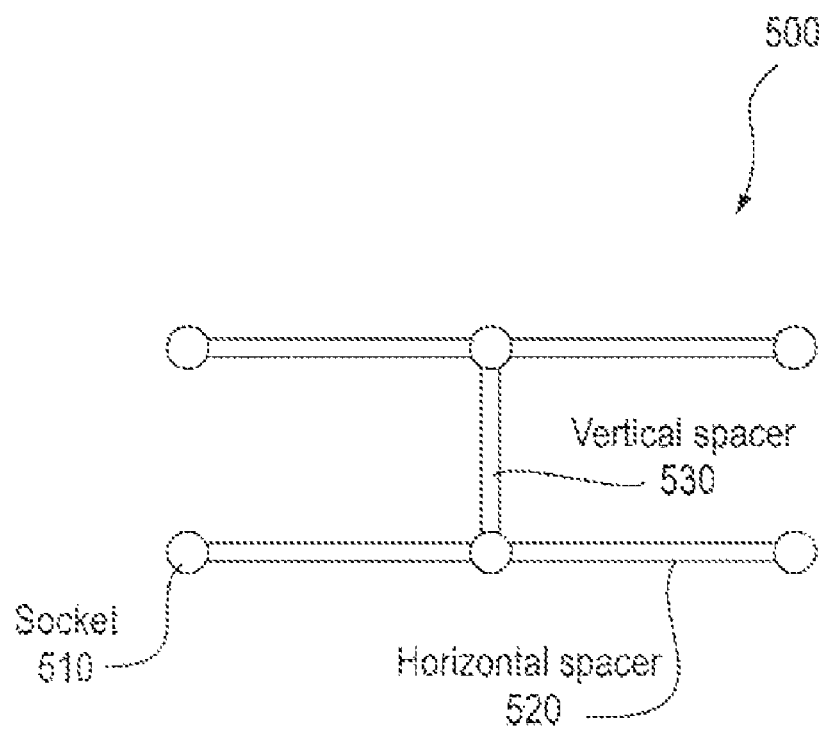
FIG. 5 illustrates an exemplary socket assembly having vertical and horizontal spacers, according to one embodiment.

FIG. 5 illustrates an exemplary socket assembly having vertical and horizontal spacers, according to one embodiment. Socket assembly 500 includes horizontal spacer 520 and vertical spacer 530 that attach to sockets 510 using connectors. Socket assembly 500 enables the construction of regular grids of sockets, where the sockets 510 are aligned both horizontally and vertically.

In one embodiment, connectors for horizontal and/or vertical spacers are at different heights to allow those in one direction to go under the shingles and those in the other direction to be above the shingles.

Figure 6:
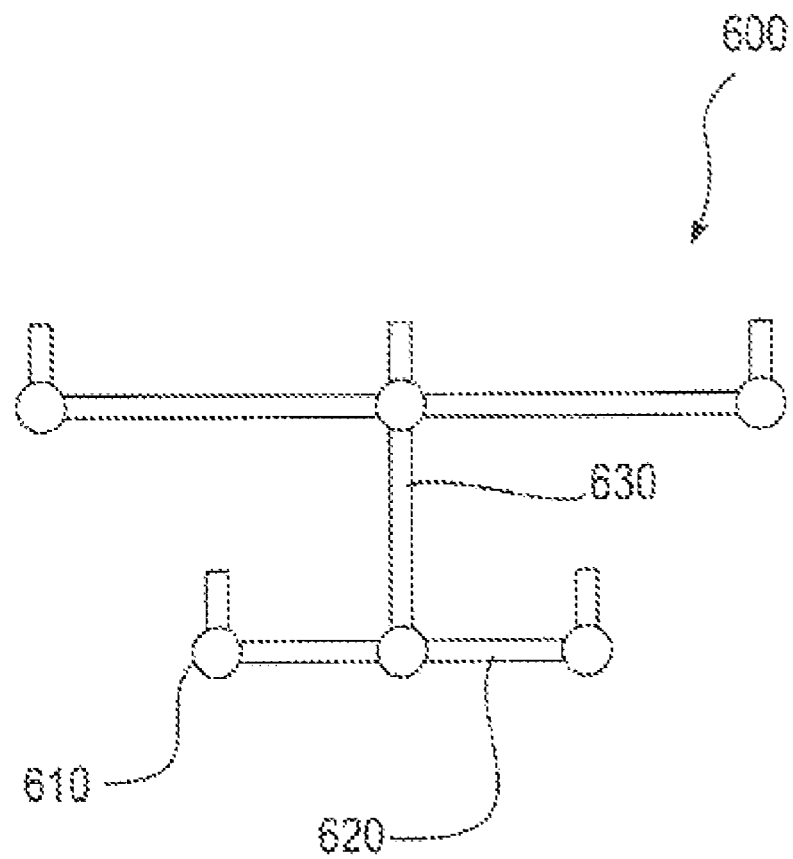
FIG. 6 illustrates an exemplary socket assembly for an offset grid, according to one embodiment.

FIG. 6 illustrates an exemplary socket assembly for an offset grid, according to one embodiment. In one embodiment, connectors for horizontal spacers 620 are contained on one or both sides of each socket 610. In addition, each socket 510 may have connections for vertical spacers 630 that are on the top and/or the bottom of each socket 610. In one embodiment, another vertical connection is contained in one or both of the top and bottom of the center of each horizontal spacer. This enables building an offset grid, where each horizontal row is offset from the next.

Figure 7A:
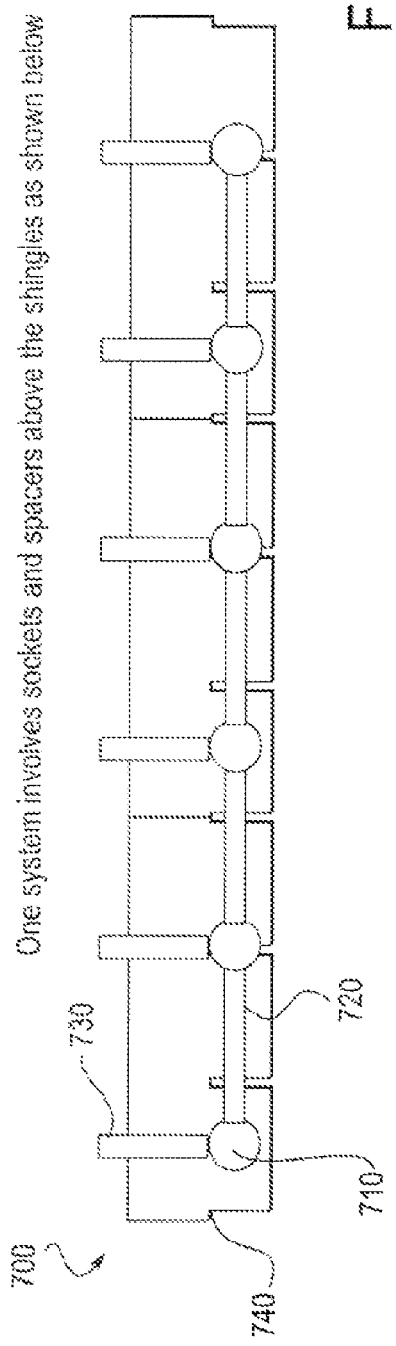
FIG. 7A illustrates an exemplary installed socket assembly, according to one embodiment.
Figure 7B:
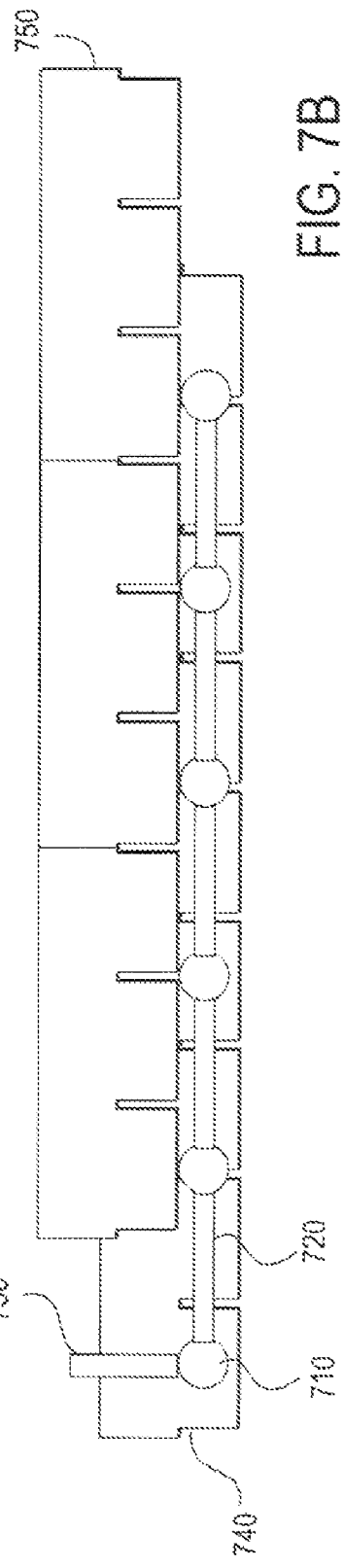
FIG. 7B illustrates installed socket assembly with a second row of shingles, according to one embodiment.

FIG. 7A illustrates an exemplary installed socket assembly, according to one embodiment. The socket assembly is installed on top of roofing shingles 740. Horizontal spacers 720 ensure a predetermined distance between sockets 710. Vertical spacers 730 may also be used. FIG. 7B illustrates installed socket assembly with a second row of shingles, according to one embodiment. The second row of shingles 750 is installed on top of the socket assembly such that vertical spacers 730 are no longer visible.

Figure 7C:
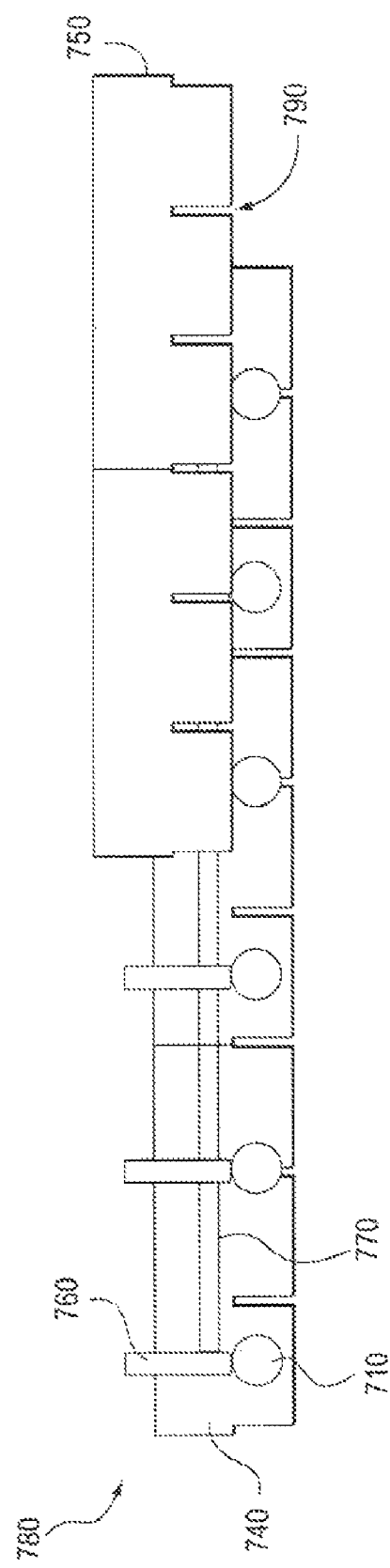
FIG. 7C illustrates an exemplary installed socket assembly, according to another embodiment.

FIG. 7C illustrates an exemplary installed socket assembly, according to another embodiment. The socket assembly 780 is installed on top of roofing shingles 740. Socket assembly 780 has horizontal spacers 770 that ensure a predetermined distance between sockets 710. Socket assembly 780 also has vertical spacers 760 may also be used with connectors to mate with horizontal spacers 770. Socket assembly 780 allows for the horizontal spacers 770 and vertical spacers 760 to be concealed by the second row of shingles 750. Sockets 710 are accessible just below the edge of the second row of shingles 750. In another embodiment, horizontal spacers act as flashing to prevent the flow of water or direct the flow of water. In another embodiment, the sockets 710 protrude between slits 790 of the second row of shingles 740.

The socket assemblies illustrated in FIGS. 7A through 7C may be pre-built, preconfigured units (for example 4 sockets in a row) or field-installable configurable.

In one embodiment, some or all of the spacers also provide an electrical interconnect function. This electrical interconnection may include unidirectional or bidirectional power, data, and/or control signals. In one embodiment, the electrical connection is automatically made when the spacer is joined to its mating piece (socket assembly or other spacer). In one embodiment, this connection is watertight. In one embodiment, the location of this connection falls within a space that is protected from weather, such as under a shingle.

In one embodiment, the sockets are electrically connected in parallel, so that the electrical current generated by solar collectors attached to each socket is additive.

In one embodiment, the sockets are electrically connected in series, so that the electrical voltage generated by solar collectors attached to each socket is additive.

Figure 7D:
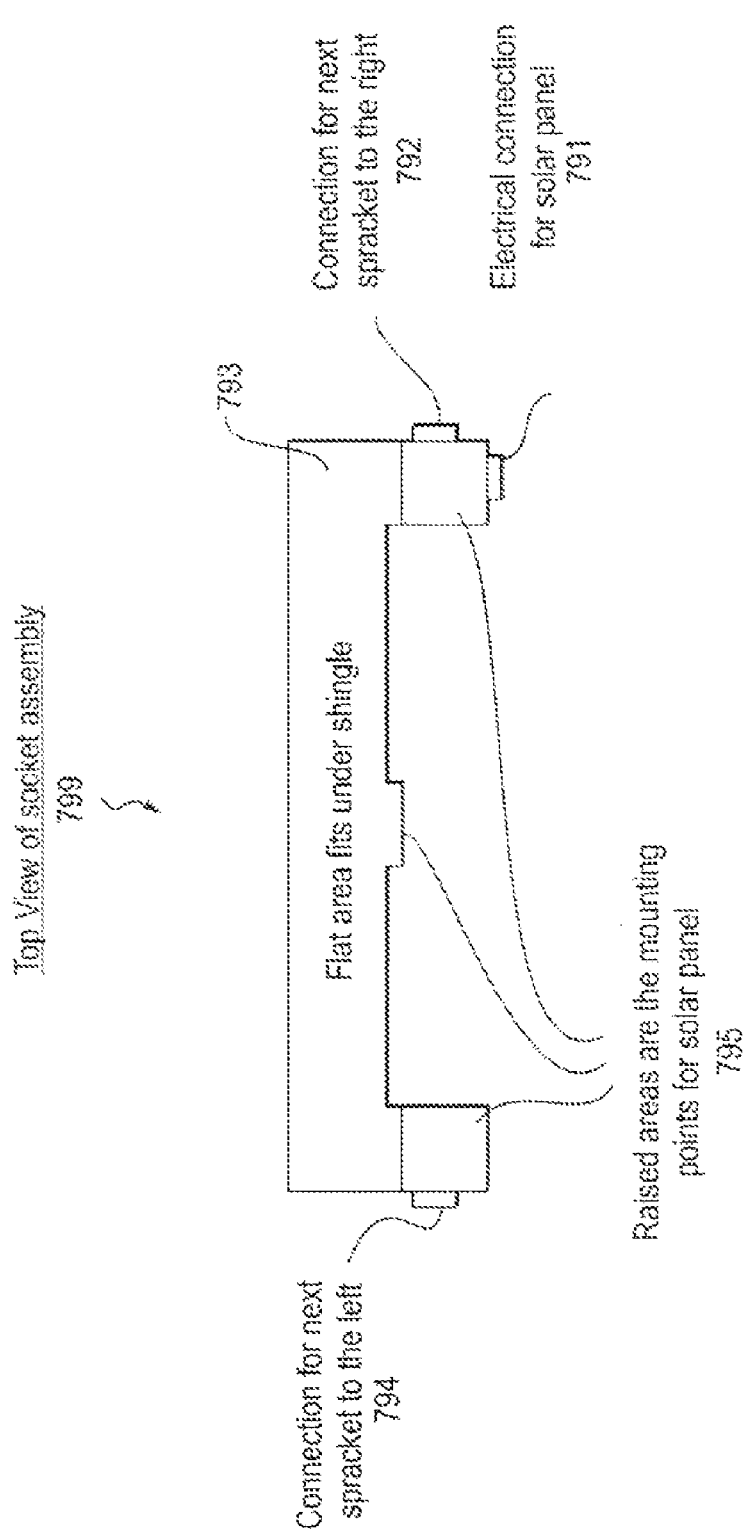
FIG. 7D illustrates a top view of a socket assembly, according to one embodiment.

FIG. 7D illustrates a top view of a socket assembly 799, according to one embodiment. Socket assembly 799 has raised areas that are the mounting points for a solar panel. Connectors 792 and 794 accept horizontal extensions or may be directly connected to another socket assembly 799. Socket assembly 799 also includes electrical connector 791 for a solar panel. Flat area 793 fits underneath a shingle and may be attached to a roof.

Figure 8B:
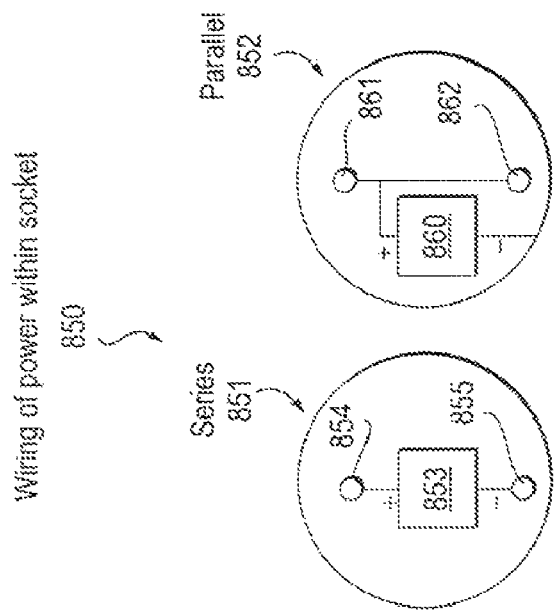
FIG. 8B illustrates an exemplary wiring diagram of a socket, according to one embodiment.
Figure 8A:
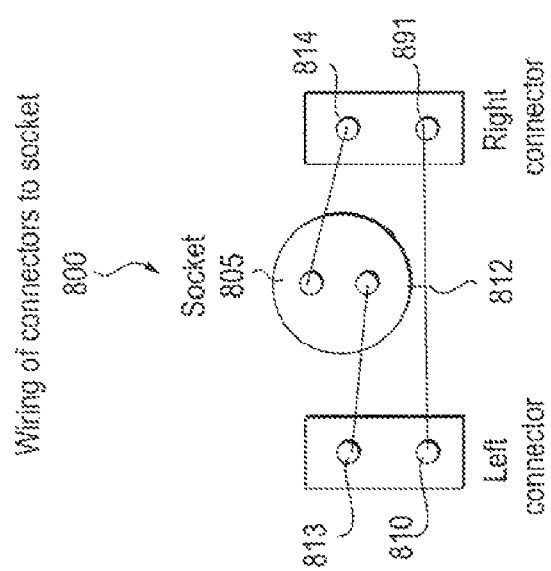
FIG. 8A illustrates an exemplary wiring diagram for connections to a socket, according to one embodiment.

FIG. 8A illustrates an exemplary wiring diagram for connections to a socket, according to one embodiment. A common wire is connected to socket 805, left common connector 810 and right common connector 811. The live connectors of socket 805 are connected to each of right 814 and left 813 connectors. In one embodiment, the sockets are electrically connected in a combination of parallel and series. In one embodiment, wires are carried to each socket to allow the configuration of parallel or series to be made by the devices within the sockets.

FIG. 8B illustrates an exemplary wiring diagram of a socket, according to one embodiment. Series socket 851 includes solar panel 853 between node 854 and node 855. Parallel socket 852 includes circuit 860, which may be a solar panel, or may include both a solar panel and an inverter, connected in parallel to node 861 and node 862. In one embodiment, wiring of parallel and series is determined by the geometric configuration, for example the system is built such that horizontal interconnections are in series and vertical interconnections are in parallel. In one embodiment, wiring of parallel and series is determined by configuration of the socket assembly. For example, the socket assembly has a switch to determine parallel or series. Another embodiment, has multiple connectors on the socket assembly, and parallel or series is determined by which connector is used. Those skilled in the art will recognize that other mechanisms could be used for determining parallel versus serial.

In one embodiment, a material is embedded within or on top of the socket assemblies and/or the spacers to hold down shingles that are resting on top of said component. In one embodiment, this material is heat-sensitive, activated by the heat and pressure from the shingle above on a hot and/or sunny day.

In one embodiment, multiple sockets are built into the same shingle and are electrically interconnected within the shingle.

In one embodiment, shingles that have built-in sockets automatically interconnect to each other when installed on the roof. The interconnection system includes both shingles that have built-in sockets and shingles that act as horizontal and/or vertical conduits for electrical connection between shingles that contain sockets.

Those skilled in the art will recognize that any of the interconnection schemes listed for socket assemblies apply equally to sockets that are integrated into shingles.

In one embodiment, the socket assemblies are not attached directly to the roof, but instead are attached to racks which in turn are attached to the roof. In one embodiment, the sockets are an integral part of the racks. In one embodiment, the racks are pre-wired. In one embodiment, the racks are designed to swing upward in whole or in sections to allow access to the underlying roof and to make installation and maintenance of the solar collection modules easier. The racks may take any of a number of physical configurations, including but not limited to space frames consisting of pipes, rods, plates, or solid platforms of wood, plastic or other materials.

In one embodiment, fuses, fusible links, circuit breakers or other overcurrent safety devices are included within the socket assemblies and/or the spacers to provide overcurrent protection.

In one embodiment, each solar collector modules directly outputs the DC voltage generated by the solar photovoltaic cells within that module. In one embodiment, the solar collector modules output a DC voltage that is different from the DC voltage generated by the solar photovoltaic system within the module, converted to that voltage through the use of a DC to DC converter.

In one embodiment, the solar collector modules output AC voltage that is converted from the DC voltage generated by the solar photovoltaic system within the module. In a preferred embodiment, the AC signal is generated within each module to conform to the parameters and/or meet the safety standards necessary for direct interconnection to the home's main circuit panel, and through optional additional safety equipment, to the grid. In other words, the functions (or a subset of the functions) of a standard solar power inverter for use in a grid-connected system is distributed and contained within the solar collection modules.

In one embodiment, the functions (or a subset of the functions) of other types of solar energy inverters, regulators, converters, chargers, and/or any other type of electronics for use with solar energy systems are distributed and contained within the solar collection modules.

In one embodiment, the power from some solar collector modules may be switched off by a physical or electronic switch built into the module and/or the socket.

In one embodiment, safety features are present in solar collection modules that eliminate their ability to generate electricity unless they are properly installed and configured in a working solar power system. This function is referred to as "anti-islanding." In one embodiment, the solar collection modules only put out power when a special control signal is present. This signal may be (but is not limited to) a signal sent across the network, and/or the presence of external power at the module connection points.

In one embodiment, data is communicated between some or all solar collection modules and other consumers or generators of data. The consumers and generators of data may include but are not limited to:
 a. Other solar collection modules on the same roof
 b. A house controller that monitors and/or displays and/or manages energy generation and/or consumption within the home
 c. A gateway device that interfaces the solar collection modules to another device, such as a device that provides an internet connection
 d. PCs and any software on said PCs
 e. Other embedded devices within the home, such as the thermostat
 f. Information sources and/or providers on the Internet, such as the local power generation company In one embodiment, this data is used to perform one or more of the following functions:
 a. Display data on energy generation and/or usage
 b. Generate billing that takes into account solar energy generation
 c. Monitor solar collectors for proper functioning and/or isolate faults
 d. Confirm proper installation of socket assemblies and/or solar collection modules.
 e. Allow utility-scale load balancing
 f. Allow load balancing within the home
 g. Reducing peak energy usage by timing large electrical loads (such as air conditioner startup) to occur only during high solar power generation
 h. Provide a signal that is used to implement anti-islanding, wherein the external device monitors the presence of external power, and communicates the presence to the solar panels In one embodiment, wires that are separate from power wires are used to carry data to or from the socket and/or the device plugged into the socket.

In one embodiment, wireless networking is used to carry data to or from the socket and/or the device plugged into the socket.

In one embodiment, carrier current technology, in which a data signal is superimposed on the power wires, is used to carry data to or from the socket and/or the device plugged into the socket. In a preferred embodiment, Ethernet protocols are used with this carrier current methodology.

In one embodiment, serial numbers are associated with each solar collection module. In one embodiment, serial numbers are associated with each socket. Socket serial numbers and module serial numbers may or may not match. In one embodiment, serial numbers are bar-coded (or coded using other machine-readable coding system) on socket assemblies and/or on solar collection modules.

In one embodiment, serial numbers may be queried by devices on the network.

In one embodiment, devices within the network (for example, other solar collection modules) note the existence of all serial numbers as they are installed. In one embodiment, each device on the network sends a periodic "I'm alive" signal indicating proper functioning. In one embodiment, if any working device on the network (such as another solar collection module) notes a fault with any of the devices with serial numbers (the device reports itself as faulty or stops its "I'm alive" signal altogether) the working device may perform (but is not limited to) one or more of the following actions:
 a. Sound an audible alarm
 b. Provide a visual alarm (such as a flashing LED)
 c. Send a network signal to a device on the network, or across the Internet
 d. Send an e-mail
 e. Cause another device on the network (such as the home thermostat or PC) to indicate the fault In one embodiment, other information is available across the network connection. This information may include, but is not limited to:
 a. Instantaneous power generated (volts and/or amps) by the module
 b. Historical (average, histogram, power versus time of day, etc.) power generated by the module
 c. Frequency of power
 d. Faults In one embodiment, information necessary for successful interconnection to house power is provided via the data network to the solar collection modules. This information could include but is not limited to voltage, phase, and frequency information.

In one embodiment, information collected from the data network is used to optimize solar power. For example, if modules in one area of the roof receive reduced solar radiation at certain times of the day relative to modules on other parts of the roof, a message could be sent to the homeowner indicating that the homeowner should check for trees or other obstacles that shade that part of the roof during that part of the day.

In one embodiment, GPS technology is used to associate particular sockets and/or solar collection modules with particular physical locations on the roof.

In one embodiment, time-domain reflectometry is used to create a topographical map of the sockets and/or the solar collection modules. This map may be used (but is not limited) to verify correct installation or monitor the system for wiring or other faults.

Figure 9:
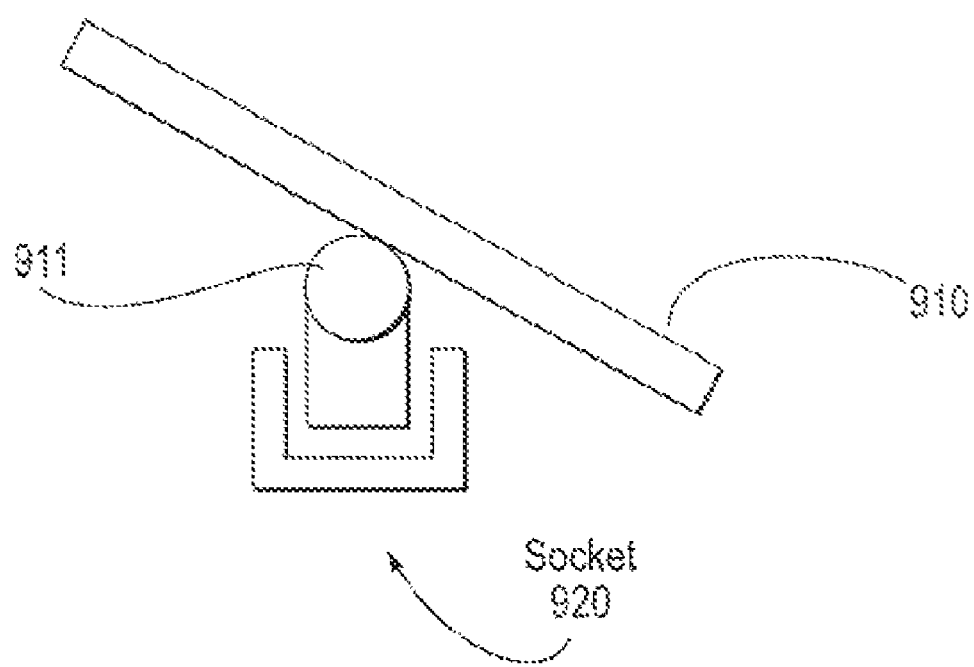
FIG. 9 illustrates an exemplary jointed solar collector and socket combination 900, according to one embodiment.

FIG. 9 illustrates an exemplary jointed solar collector and socket combination 900, according to one embodiment. Solar collection module 910 contains a joint 911 that allows module 910 to be statically aimed at installation time in the best direction for collecting sunlight.

In one embodiment, the solar collection modules are able to track the sun for maximum efficiency. This tracking may either be in one dimension (typically used for tracking sun position during the course of the day) or in two dimensions (this allows for tracking across the seasons as well).

In one embodiment, the tracking utilizes electronic detectors for the position of the sun.

In one embodiment, the tracking utilizes bimetal strips that are heated by the sun. Bimetal strips bend or straighten according to their temperature. The strips are arranged such that the bending of the strips due to heating changes the aim of the solar collection module. The optics and geometry of the module is designed such that heat from the sun deforms the strips so that they keep the solar collection module aimed at the sun.

In one embodiment, tracking is based on a timer (time of day) and/or a calendar. In one embodiment, time and/or date is downloaded from a remote data source using the data communications function described earlier.

In one embodiment, longitude, latitude, and baseline orientation are determined using electronic sensors that measure the position of the sun and compare it to date and time of day. In one embodiment, a single solar collection module contains the necessary sensors and uses the data network to tell other solar collection modules the necessary information. This lowers system cost since the sensor system need only exist in a single solar collection module within an installation.

In one embodiment, solar collection modules use solar concentration technology.

Those skilled in the art will recognize that the functional division between the socket and the solar collection module is arbitrary, and that any functions described as being within one may be within the other and vice versa. Description in this patent of any given function being within one does not mean this patent does not apply if the system is configured for the function to be within the other, and in particular this patent still applies if the functions of the socket and the solar collection module are integrated together.

In one embodiment, solar collection modules are available in a number of different shapes, including but not limited to one or more of square, triangle, trapezoid, hexagonal, and/or round shapes.

FIG. 10A illustrates an exemplary flip-up solar collector having one joint, according to one embodiment. Flip-up solar collector 1000 connects physically to a socket 1010. Solar panel 1041 is connected to fixed member 1040 via joint 1020. FIG. 10B illustrates an exemplary flip-up solar collector having two joints, according to one embodiment. Flip-up solar collector 1050 connects physically to a socket 1010. Solar panel 1051 is connected to a moveable member 1060 via joint 1020. Moveable member 1060 is connected to joint 1030, as well. In one embodiment, the top face of the solar collection modules may flip up to facilitate installation and/or roof maintenance.

In one embodiment, the sockets are connected to the home's electrical system through an interface module. This interface module provides (but is not limited to) one or more of the following functions:
  a. Monitoring
  b. Safety (circuit breaker, etc.)
  c. Inverter
  d. Capability to remotely enable and/or disable the solar energy collection system through an external signal, including (but not limited to) signals across the network or through the cell phone network
  e. Testing/verification
  f. Controlling other functions of the system In one embodiment, some or all of the functions on the interface module are performed by units contained within the following form factor(s):
  a. Separate enclosure
  b. Same form factor as a circuit breaker within a standard electrical panel
  c. Integrated into the solar collectors
  d. Integrated into the socket assemblies, spacers, or other components of the roof system
  e. Integrated into a conduit In one embodiment, the interface module is located near the house electrical panel and is wired to the socket assemblies using a modular plug-together system that does not require an electrician. In one embodiment, this interface module enclosure is modular, and may be installed without some components. In this embodiment these components may be added later. This is useful for saving cost at installation time or eliminating the need for a licensed electrician, since the components that are installed when sockets are installed are mechanical (e.g., the enclosure) rather than electrical.

In one embodiment, not all sockets are wired to each other or to the house electrical service. These non-wired sockets provide mechanical support to solar collection modules without providing electrical connection. These non-wired sockets may or may not have the same physical form factor and/or mounting system for the solar collection modules as wired sockets. When non-wired sockets are used, solar collection modules are interconnected to each other externally from the sockets. In one embodiment, the solar collection modules are interconnected to each other using a physical interconnection scheme, which could involve (but is not limited to) a mating connector or component that is used to attach adjoining solar collection modules to each other. In one embodiment, the solar collection modules are electrically interconnected to each other using inductive techniques.

In one embodiment, a device is available that turns a single socket into multiple sockets. For example, a device could be available that screws into one socket and provides three sockets with wiring and with the correct physical spacing. There is no limitation on the number of sockets that may act as a mounting and electrical connection point for this device and the number of sockets provided. For example, a device may be constructed that screws into 4 sockets that provides 8 sockets in an appropriately spaced manner.

In one embodiment, solar collection modules are mechanically interconnected to each other to enhance mounting rigidity. This interconnection may take the form of physical interconnection (such as a latch, a bolt, a screw, glue, sticky pad, etc.) or through other means (such as magnetic).

In one embodiment, the socket assemblies contain mechanical features that enhance the mechanical stability of the modules. These features may include (but are not limited to) hold-down ties, guy wires, cradle rests that limit rocking, outrigger structures that the collectors rest on, pads, magnetic attachment points, etc.

In one embodiment, other types of solar collectors are attached to the socket system. In particular, standard rectangular solar panels may be attached to a roof using any standard mounting system and electrically attached to the home via a socket. In one embodiment, adapter components are provided that allow flat panels to be mounted mechanically on the socket system.

In one embodiment, unused sockets are covered by caps that protect the socket and/or help the sockets blend into the roof.

In one embodiment, an indicator is included as part of the socket, cap, and/or solar collector module, which indicates successful interconnection to other sockets and/or to the house electrical system. In a preferred embodiment, this indicator is positioned on the socket and/or cap in such a way that it can be seen from the ground below the roof. In a preferred embodiment, this indicator is an LED, wired in series with a resistor to light when the socket is provided with standard house voltage. In one embodiment, this indicator is included on the solar panel.

In one embodiment, a device or feature is provided in the interconnect system of the sockets to the house electrical system, which allows an on-off sequence of house current to be applied to the sockets. This enables flashing of socket or cap indicator lights, which is useful for verifying proper installation of the system. In one embodiment, this feature is included on the solar panel.

In one embodiment, the sockets and/or the solar panel assemblies include one or more display lights that are addressed through the network. This, for example, enables the collectors to become animated Christmas light displays that are controlled through the network.

In one embodiment, the socket is formed by stamping two pieces of sheet metal that are interconnected with insulating material (such as a plastic shell). One piece of sheet metal is stamped to form one connection of the socket and one pin for each of the interconnection connectors, and the other piece of sheet metal is stamped to form the other connection of the socket and the second pin for each of the interconnection connectors.

In one embodiment, the sockets provide two-way water connection instead of or in addition to electrical connection. Interconnection of sockets includes all of the configurations listed for electrical interconnection, but instead involves liquid interconnection. The present system may be used for domestic space, water, or swimming pool heating, potentially in combination with electricity.

One embodiment has the following components:
a. Socket assembly with flange for 3-tab asphalt shingle roof, including 2 flush horizontal and 2 raised vertical connections.
b. Horizontal spacers with integrated electrical wires designed to be installed under shingles. These spacers include 2 raised vertical connections in the center.
c. Vertical spacers with integrated electrical wires.
d. Round solar photovoltaic collectors that screw into the sockets and have all electronics necessary to interface to house electrical system built in. These collectors also have carrier-current Ethernet capability built in.
e. Adapter that allows interface of vertical spacer plug to standard waterproof conduit.
f. Interface unit that plugs into house's main breaker panel realized in the form factor of a circuit breaker for that brand electrical panel.
g. Carrier current Ethernet adapter that can be plugged into any outlet in the house and adapt carrier current Ethernet to standard RJ-45 ethernet.

In one embodiment, the sockets and socket installation are provided to the homeowner at a reduced price or for free in exchange for the homeowner committing to use a particular brand and/or type of solar collector and/or a particular vendor and/or installer when solar collectors are installed on the house.

Fire Safety System

The present system relates to novel features and mechanisms for improving the fire safety of roof-mounted solar electricity generation systems and components, which include, but are not limited to, photovoltaic panels and concentrating photovoltaics.

Building mounted solar electricity generation (solar) is greatly desired both by property owners and for the overall public good created by clean, renewable solar power. There are many safety related challenges associated with mounting solar panels on a building. One challenge relates to the ability of fire safety and emergency response personnel to quickly and easily access the areas where the solar panels are mounted, without fear of inadvertent contact with a live electrical line once the building's access to an external electrical source (the grid) is disconnected.

In an emergency, fire safety or emergency response personnel may be required to access the interior of the building through the roof or to cut holes in the roof to allow heat and/or gasses to escape. Currently, solar is mounted on rooftops in a way that requires special tools, special knowledge and considerable time to remove. Furthermore, individual collectors are connected in series, and the DC output of the collector panels are fed through an inverter that converts the DC output of the system to 60 Hz AC. When the electrical connection to the building is turned off by fire safety or emergency personnel during an emergency, the AC output of the inverter is also stopped, but the DC output of the solar panels and the DC side of the inverter are still live.

Today, if the fire safety or emergency response personnel wish to cut through the roof of a building with solar panels, either to gain access through the portion of roof under the solar panels or to cut a hole without fear of electrocution due to inadvertent contact with the live DC wiring, they are limited to two options that allow quick access to the roof during an emergency—(1) limiting the total area of allowable rooftop coverage by solar panels through regulation or (2) simple avoidance of any rooftop with solar panels mounted on it. Both of these options are onerous to building owners. In the first option, building owners are prevented from full use of their property, and the overall availability of renewable energy generation options is dramatically reduced. In the second, property owners are effectively forced to make a choice between having access to clean renewable energy or having access to the full range of available emergency response services.

Thus, there is a strong need for improvements in the manner in which solar is mounted to a rooftop and for improvements in the electrical interconnection of the components of a rooftop solar system. One area not specifically addressed by the prior systems is the ability to quickly and effectively provide both the easy and quick connection and disconnection of solar components to and from the rooftop solar system.

Throughout this specification, reference is made to metal beams. Those skilled in the art will recognize that metal beams are common construction materials. A beam is a structural element that is capable of withstanding load primarily by resisting bending. Beams are characterized by their profile (the shape of their cross-section), their length which is commonly much larger in the dimension perpendicular to the cross section, and their material. The terms beam and metal beam are used in exemplary manner and not meant to limit the application of this invention.

For the purpose of this specification, beam profiles include those commonly known to those skilled in the art and include, but are not limited to, (1) I-beams, (2) H-section beams, (3) wide flange beams, (4) universal beams, (5) HSS-Shape (Hollow structural section) or SHS (structural hollow section) beams, a term which includes beams with square, rectangular, circular (pipe) and elliptical cross sections, (6) Angle or L-shaped cross-section, beams, (7) Channel or C-channel beams with a C-shaped cross-section, (8) Tee or T-shaped cross-section beams, (9) Rail profile or asymmetrical I-beams, including, but not limited to, Railway rail, Vignoles rail, Grooved rail, Flanged T rail, (10) Bars, (rectangular cross sectioned beams) (11) Rods (round or square beams), (12) Open web joist and (13) proprietary beam shapes such as uni-rail or uni-strut.

Beam materials include metals, alloys and materials in common use as structural materials, including, but not limited to, steel, aluminum, Carbon steel, Stainless steel, Maraging steel, titanium and carbon fiber.

Existing methods and materials for mounting solar on residential and small commercial roofs is both complicated and time consuming. Typically installation requires a level of expertise that demands special training and tools. Furthermore, the tools required may be proprietary and specific to the particular brand of mounting hardware. Removal of the solar panels from the roof requires the same tools as installation and a similar amount of time, which, at a minimum is measured in tens of minutes per panel. However, in the event of a fire, a delay of even a minute in gaining proper access or properly ventilating a building may result in injury or even death.

Under existing methods and practices, no consideration is provided for removal of solar system components such as, for example, photovoltaic panels, by fire safety personnel. The firefighter is required to break through the components, which commonly are made of aluminum framed glass and silicon that can be an inch or more thick with an axe in order to get to the roof under the solar system components. The only other option is to simply forego any attempt to penetrate the roof under the solar system.

The present mounting systems for solar components such as photovoltaic panels that include mechanical and/or electrical connections for the components that can be quickly and easily removed or moved without the need for special tools or training, but which would require no tools or training other than those in current common use by fire safety personnel.

In a preferred embodiment, the attachment of the solar components to the roof includes a quick release device which includes an easily visible handle, grip or latch, all of which are hereafter referred to as "handles." The preferred embodiment further provides a mechanism by which operation of the handle causes the component to detach from the roof or mounting system or weakens the attachment such that with a relatively small effort, the components can be detached from the roof.

In the embodiment above, detachment refers to the breaking of some or all points of attachment of the component to the roof or to a roof mounting device, including, but not limited to (1) metal beams supported by feet, flanges or stanchions, (2) metal feet, flanges, stanchions or beams directly attached to the roof, (3) metal brackets. For the purposes of this disclosure, any point of attachment of the component that is broken by the release is referred to as a "mounting point." Beams may include, but are not limited to (1) I-beams, (2) H-section beams, (3) wide flange beams, (4) universal beams, (5) HSS-Shape (Hollow structural section) or SHS (structural hollow section) beams, a term which includes beams with square, rectangular, circular (pipe) and elliptical cross sections, (6) Angle or L-shaped cross-section, beams, (7) Channel or C-channel beams with a C-shaped cross-section, (8) Tee or T-shaped cross-section beams, (9) Rail profile or asymmetrical I-beams, including, but not limited to, Railway rail, Vignoles rail, Grooved rail, Flanged T rail, (10) Bars, (rectangular cross sectioned beams) (11) Rods (round or square beams), (12) Open web joist and (13) proprietary beam shapes such as uni-rail or uni-strut. Furthermore, the term "metal" may include, but is not limited to steel, aluminum, aluminum alloys, carbon steel, stainless steel, maraging steel, titanium as well as plastics and composite materials, such as delrin, polycarbonate, fiberglass, and carbon fiber.

The action of the panel following release may include (1) complete detachment of the component from all mounting points thereby allowing the component to be lifted or thrown off the roof, (2) detachment from one or more, but not all, mounting points, allowing the component to hinge, pivot around or swivel around the remaining mounting point or points, (3) detachment from one or more, but not all, mounting points, allowing two or more components to be folded together in such a manner as to allow access to the roof under the components.

In an embodiment, two components detach from the mounting points on adjacent sides of components connected by a spring or hinge, and the remaining mounting point attachments on one component are free to move horizontally. Horizontal pressure on the detached components moves the hinge up and away from the roof.

In an embodiment, the action of the release handle permanently distorts the attachment mechanism, such that the component is free to move. By using the release handle, the component, attachment brackets, and/or the release handle may deform so that it can not be used again. An example of this would be a brace that clamps a rail, including a handle that when actuated permanently deforms the brace so that it no longer clamps the rail.

In an embodiment the release handle is brightly colored and visible from above the component. Furthermore the form of the handle may be one of several known to those skilled in the art, including, but not limited to, a latch, a wire pull, spring bar, and trigger. The motion of the handle may be in the direction of perpendicular to the surface of the component, in the vertical axis of the roof and parallel to the surface of the component, in the horizontal axis of the roof and parallel to the surface of the component, a helical or twisting motion, or a combination two or more of the above motions.

Rooftop solar components are required by law to be connected by a continuous, low gauge (large diameter) conducting wire in direct contact with the frame of the component for the purpose of providing an electrical ground for the entire system. In a preferred embodiment, the ground wire described above is held to the solar component by a U-shaped washer that is designed to deform and release the ground wire when sufficient force is applied.

Preferably, the aforementioned U-shaped washer has a breaking strength between 75 and 5 pounds, more preferably between 50 and 25 pounds, most preferably between 37.5 and 27.5 pounds.

In a preferred embodiment, the point of contact for the ground wire uses a copper washer, tab, via or other connector crimped, welded or otherwise permanently affixed to the frame of the component. Preferably, at the point of connection to the ground wire, the copper connection has a breaking strength between 75 and 5 pounds, more preferably between 50 and 25 pounds, most preferably between 37.5 and 27.5 pounds.

Solar electric generation systems require electrical interconnection to transport power from the generating components to the building electrical system. Adjacent components in a rooftop solar system are most commonly connected by electrical wiring or cables. Exposed connections between components are required by regulation to have a breaking strength of not less than 35 pounds.

In a preferred embodiment, the electrical wiring, cabling or interconnect incorporates a break-away connection on the underside of the component. Preferably the break-away portion of the connection has a breaking strength of not less than 20 pounds and not more than 40 pounds.

In an embodiment, the electrical wiring, cabling or interconnect incorporates a break-away connection where the cabling, wiring or interconnect connects to the micro-inverter or junction box on the underside of the panel. The break-away junction consists of a pair of mated connectors. In one embodiment, the act of utilizing the break-away junction of the electrical connectors is "non-reversible," that is, the cabling, wiring or interconnect cannot be reconnected without new parts, special expertise, special tools or all three. In a preferred embodiment, the action of utilizing the break-away junction of the electrical connection does not break the connectors and following detachment, the cabling can be reconnected without special tools, special expertise or both.

In an embodiment, the electrical wiring, cabling or interconnect incorporates a break-away connection where the cabling, wiring or interconnect connects to the micro-inverter or junction box on the underside of the panel. The wiring is held in place by running it through a guide consisting of a slot, tab or hole in the component frame. In a preferred embodiment, the guide described above has a slot or hole with a thinner bottom edge than the rest of the frame. Preferably, the thin section of frame around the hole or slot has a breaking strength between 75 and 5 pounds, more preferably between 50 and 25 pounds, most preferably between 37.5 and 27.5 pounds.

In an embodiment, the release mechanism may be a spring mechanism, spring loaded latch, a direct latch to the mount point, a structural element, such as a tab that is broken by the action of the release handle, a rotating connection, or a screw mechanism. The release mechanism may detach the component directly from the mounting point or detach a portion of the component frame or separate the component from a connector to the mounting point.

In an embodiment, the act of releasing or engaging a latch physically severs the electrical connection, e.g. using a knife-like arrangement. In an embodiment this latch is the same latch that releases the solar component from its physical mount.

Wiper/Fluid System

Dirt and grime can reduce solar panel output by 15 to 25%. For small residential installations, cleaning services are only marginally economically viable. Example, if each cleaning costs $75, and a cleaning every 6 months improves average efficiency of a 5 kw system by 15%, if the value of electricity is 15 cents/kw-h, the cleaning will result in $180/year of extra electricity, barely exceeding the $150/yr cost of a cleaning service.

In one embodiment, a windshield wiper and fluid pump for the solar panel clean it at either regular intervals (controlled by a timer), or irregular intervals (controlled by a sensor, such as dirt or rain, or by monitoring panel output for reduced efficiency, possibly compared to internet-based sunlight data).

In one embodiment, wiper blade and fluid are replaceable by the owner or a service company. The anticipated cost is a little more than the cost of a normal cleaning ($75 per visit), but could be over a much longer interval (amount of time wiper blade and fluid lasts), perhaps 5 years, resulting in much better economics.

In one embodiment, no physical wiper is present. Instead, either a self-clearing fluid is sprayed onto the solar panel, or a combination of air and fluid is sprayed onto the solar panel. The air may be entrained in the fluid, or may be sprayed after the fluid. These items may be sprayed from a fixed spray head, or from a moving arm. There may be one or more nozzles.

In one embodiment, rainwater is collected by the system for use in cleaning the solar panels. Rainwater that is collected is mixed with detergent for cleaning the solar panel. The detergent may be either solid or liquid.

In one embodiment, the fluid is contained within a replaceable cartridge. In one embodiment, the fluid is contained within a replaceable bag. In one embodiment, fluid is contained in a refillable reservoir. In one embodiment, fluid containers are interconnected between panels.

In one embodiment, a replaceable wiper blade includes an integrated fluid container that includes enough fluid to last the life of the wiper blade.

In one embodiment, the fluid nozzle is replaceable. The nozzle may be integrated into the replaceable wiper and/or fluid components described above.

In one embodiment, an air blower is incorporated, for removal of large debris such as leaves.

In one embodiment, fluid reservoirs may be filled by connecting to the building's existing water supply via pipe, hose or other connection. In one embodiment, any water required for operation of the device is directly taken from the building's existing water supply via pipe, hose or other connection.

Figure 11A:
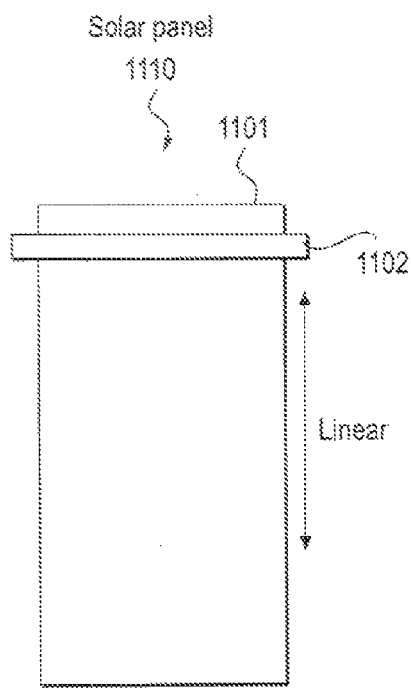
FIG. 11A illustrates an exemplary solar panel assembly with a linear wiper, according to one embodiment.

FIG. 11A illustrates an exemplary solar panel assembly with a linear wiper, according to one embodiment. Solar panel assembly 1110 includes a solar panel 1101. A motor operates to move wiper 1102 in a linear motion to clean solar panel 1101.

Figure 11B:
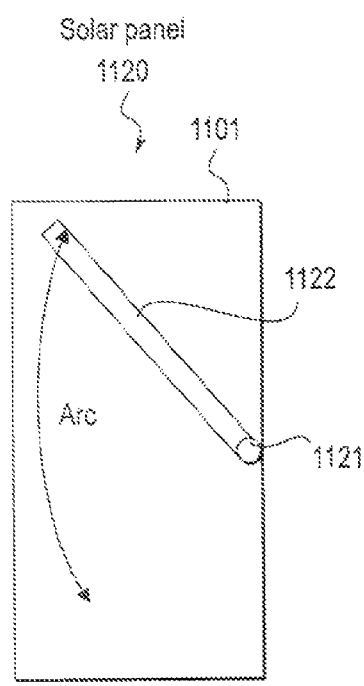
FIG. 11B illustrates an exemplary solar panel assembly with an arcing wiper, according to one embodiment.

FIG. 11B illustrates an exemplary solar panel assembly with an arcing wiper, according to one embodiment. Solar panel assembly 1120 includes a solar panel 1101. A motor 1121 operates to rotate wiper 1122 in a arcing motion to clean solar panel 1101.

Figure 11C:
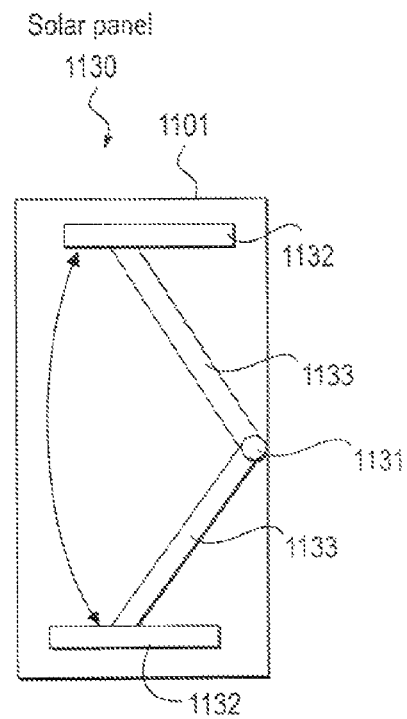
FIG. 11C illustrates an exemplary solar panel assembly with an arcing wiper with linkage, according to one embodiment.

FIG. 11C illustrates an exemplary solar panel assembly with an arcing wiper with linkage, according to one embodiment. Solar panel assembly 1130 includes a solar panel 1101. A motor 1131 operates to rotate linkage 1133. Linkage 1133 keeps wiper 1132 traveling at a predetermined angle across the face of solar panel 1101. Solar panel assembly 1130 has wiper 1132 and linkage 1133 at both extremes of motion, at the top and bottom of solar panel 1132.

Figure 11D:
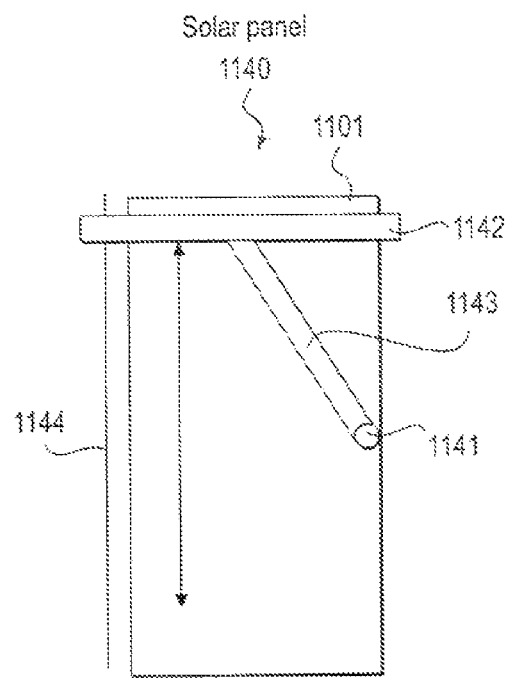
FIG. 11D illustrates an exemplary solar panel assembly with an arcing wiper with linkage that follow a track, according to one embodiment.

FIG. 11D illustrates an exemplary solar panel assembly with an arcing wiper with linkage that follows a track, according to one embodiment. Solar panel assembly 1140 includes a solar panel 1101. A motor 1141 operates to rotate linkage 1143. Linkage 1143 in combination with track 1144 keeps wiper 1142 traveling at a predetermined angle across the face of solar panel 1101.

Wiring and Cabling System

Figure 12A:
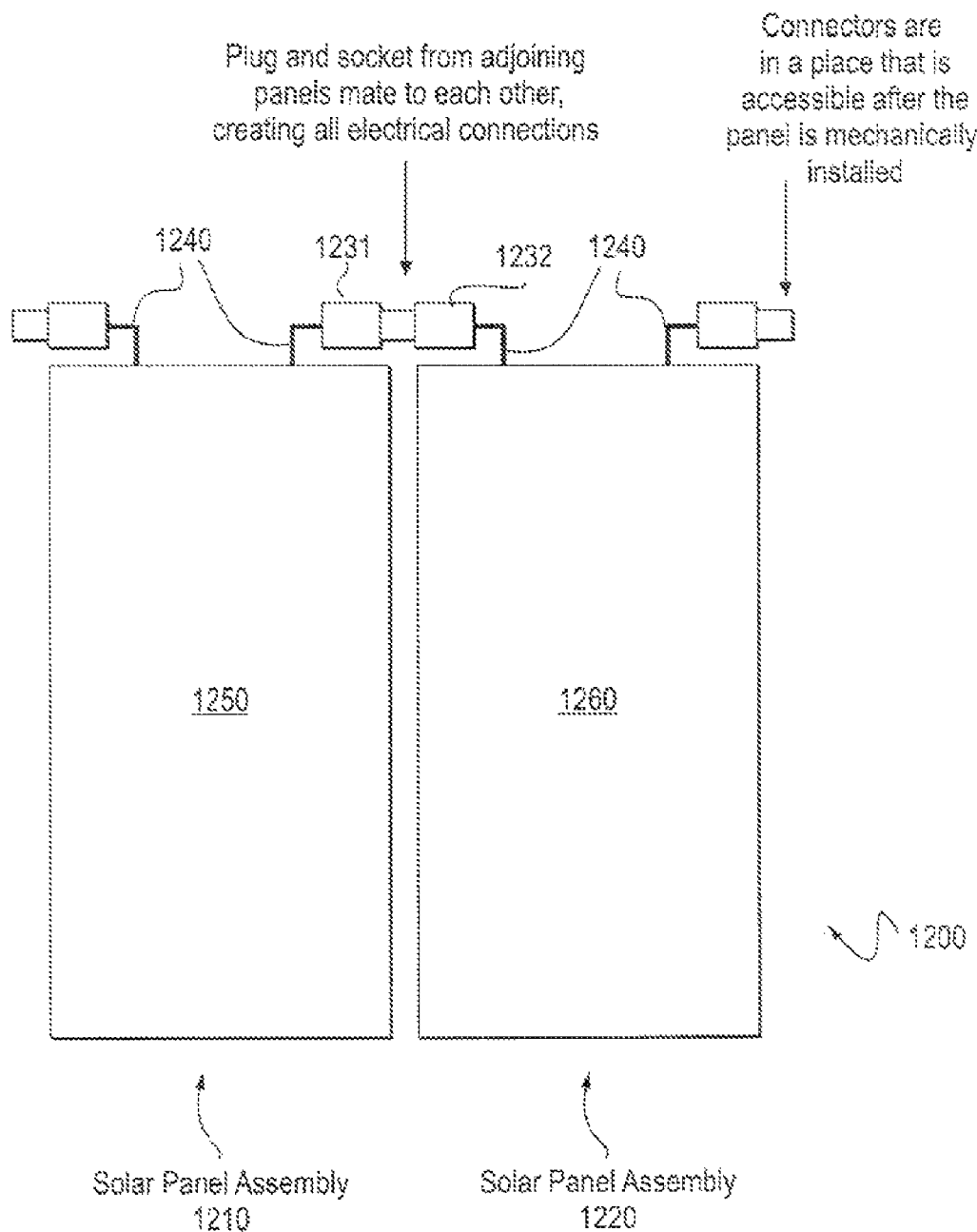
FIG. 12 illustrates an exemplary solar panel system with adjacent panels plugged together in a daisy chain fashion, according to one embodiment.

FIG. 12 illustrates an exemplary solar system with adjacent panels plugged together in a daisy chain fashion, according to one embodiment. Solar system 1200 has solar panel assembly 1210 adjacent to solar panel assembly 1220. Solar panel assembly 1210 has a plug and socket 1231 that electrically connects to plug and socket 1232 of solar panel assembly 1220.

The plug and sockets 1231 and 1232 may be male and female, respectively, or they may be androgynous. Solar system 1200 has an arrangement where the plug and socket 1231, 1232 are each connected to a cable, but those skilled in the art will recognize that the arrangement will work equally well if one side is a panel-mount connection on the solar panel.

In one embodiment, the wires are spring-loaded, such that when not connected, the plugs retract towards the solar panel.

In one embodiment, the wires 1240 are spring-loaded, such that after connecting, the plugs 1231, 1232 retract towards the solar panel collectors 1250, 1260.

Figure 12B:
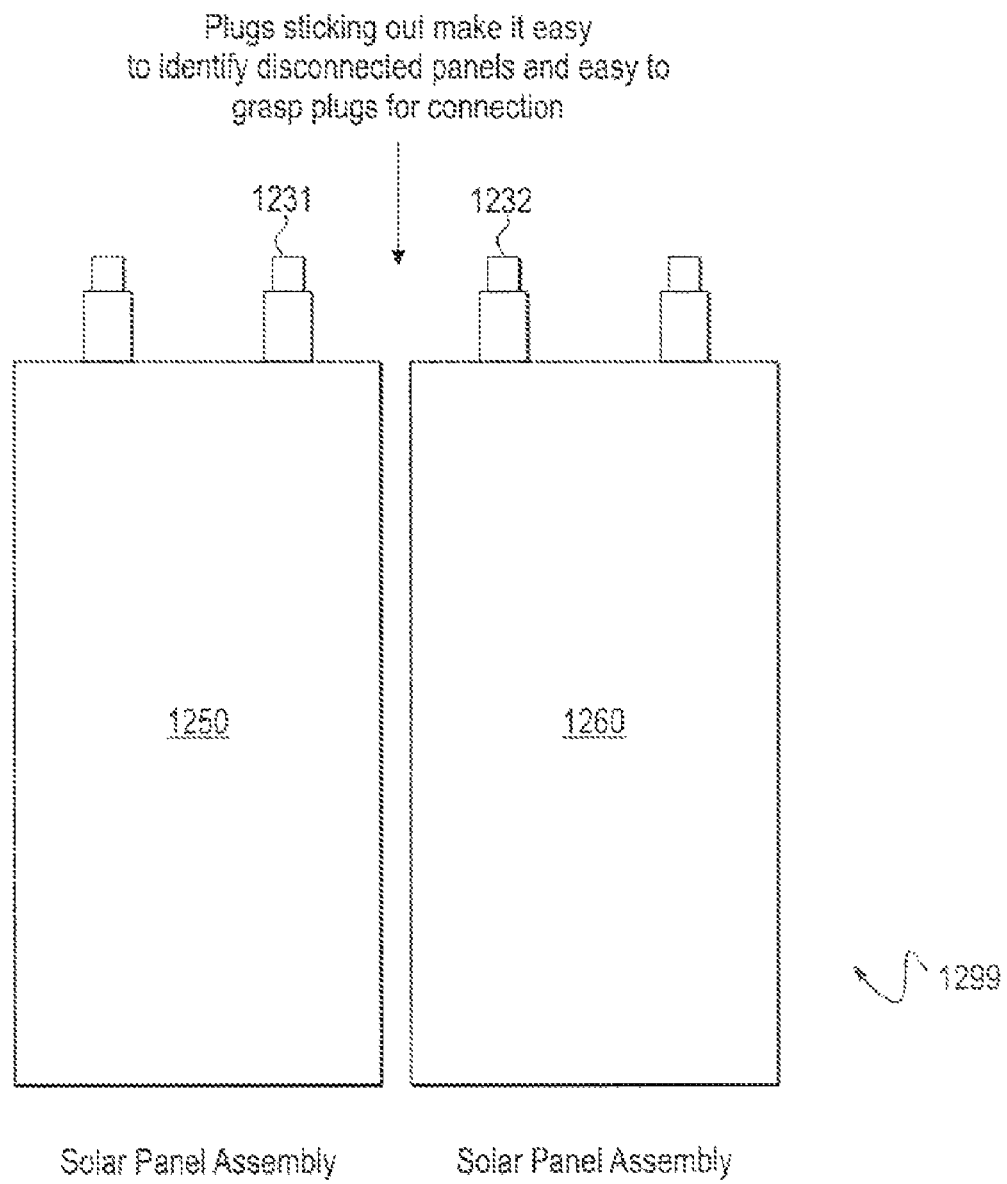

FIG. 12B illustrates an exemplary solar system with disconnected panels, according to one embodiment. In one embodiment, solar system 1299 has plug and sockets 1231, 1232 disconnected. Sockets 1231, 1232 stick out from the solar panel assemblies 1250, 1260 making identification of the sockets 1231, 1232 as well as handling of the sockets

1231, 1232 easier to connect. The wires are retracted within solar panel assemblies 1250, 1260.

In one embodiment, when the wires are connected to each other, they rotate 90 degrees, allowing them to be placed or spring-retracted into a position below the solar panel.

Those skilled in the art will recognize that a full range of wiring accessories can be made available and may be needed. These include extension cords that allow solar panel assemblies that are on different rows or are on different parts of the roof to be connected, Y-connectors, gender changers, or special cables for connection to the electrical panel.

In one embodiment, a cord connects to the electrical panel. The cord has one end that has a connector that mates to the solar panel assemblies, and another that has bare wires for connection inside an electrical panel. In one embodiment, the cable is shielded with rigid or flexible metal conduit, such that it meets electrical code standards for outdoor wiring in an unprotected location.

In one embodiment the connector system is hermaphroditic, in which the same cable for connecting to the electrical panel may connect to either connector on the solar panel assembly.

In one embodiment, connecting rows of solar panel assemblies to each other requires no extension cable because the fully-extended length of the cable from the solar panel is long enough to reach from row to row.

The solar panel assemblies may be wired together in series (which is used if the direct DC output of the panels is desired) or in parallel (which is used if the panel power is internally converted to AC or to some form of normalized DC). This electrical system applies to both situations, although the schematic of wiring is a little different for each.

Figure 13:
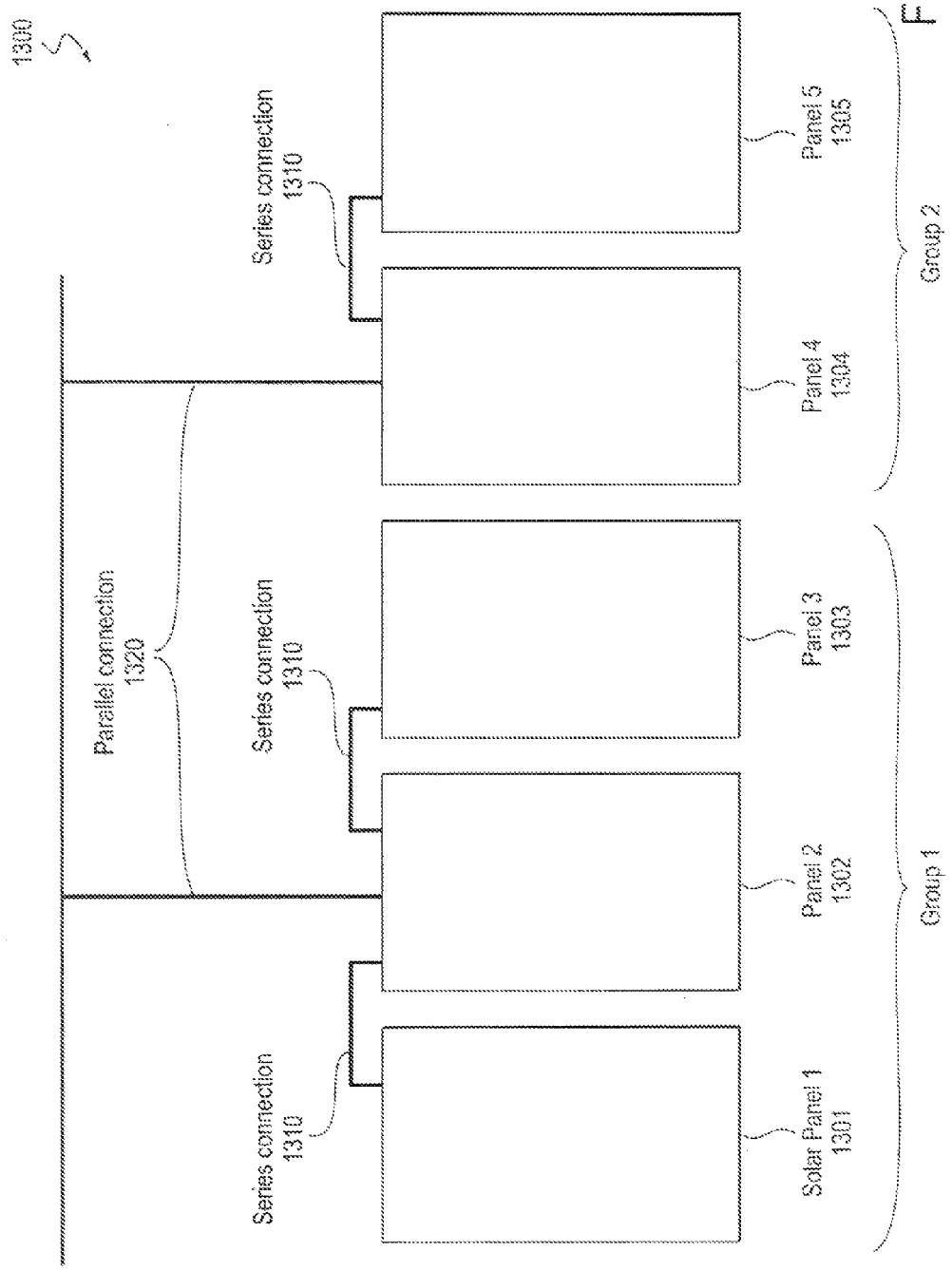
FIG. 13 illustrates an exemplary solar panel system having solar panels having both series and parallel connections, according to one embodiment.

FIG. 13 illustrates an exemplary solar system having solar panels having both series and parallel connections, according to one embodiment. Solar system 1300 has solar panel assemblies 1301-1305. Solar panel assembly 1301 and solar panel assembly 1302 have a series connection 1310. Solar panel assembly 1302 and solar panel assembly 1304 have a parallel connection 1320. Thus, solar panel assemblies group 1 and solar panel assemblies group 2 are connected using parallel connection 1320. In one embodiment, two separate connector systems are used, one for the series connection, and another for the parallel connection. In this embodiment, groups of solar panel assemblies are connected to each other in series, and the groups of series connected panel assemblies are connected together in parallel.

Figure 14:
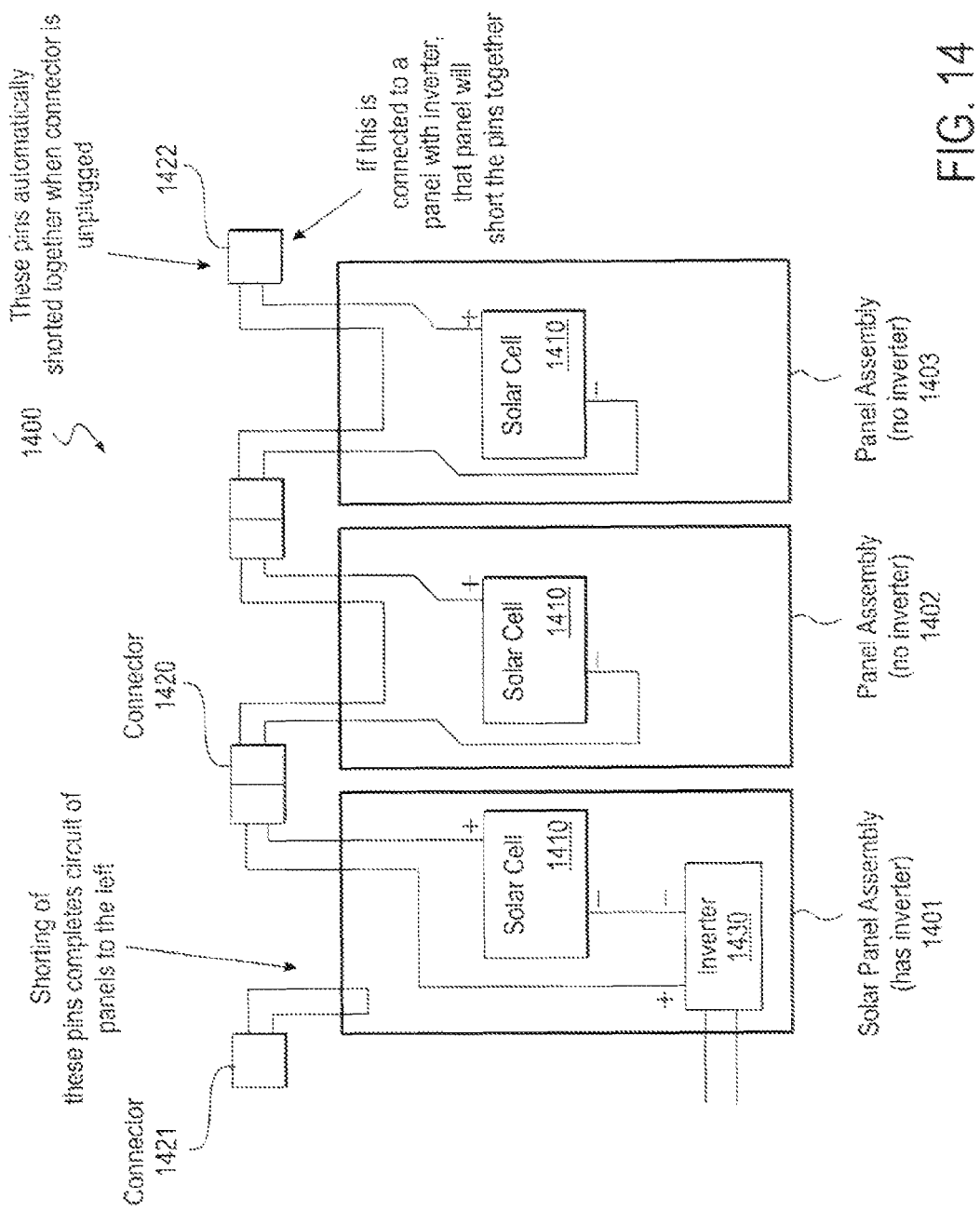
FIG. 14 illustrates an exemplary wiring diagram for solar panel system, according to one embodiment.

FIG. 14 illustrates an exemplary wiring diagram for a solar system, according to one embodiment. Solar system 1400 has solar panel assemblies 1401-1403. Each solar panel assembly 1401-1403 has a solar cell 1410. Solar panel assemblies 1401-1403 are electrically connected in a series configuration using connectors 1420. Connectors 1420 may be plug and sockets, as described above. Solar panel assembly 1401 has an inverter 1430, whereas solar panel assemblies 1402 and 1403 do not have inverters. Connector 1421 may be shorted to complete the circuit of panels. In another embodiment, inverter 1430 is switched to connector 1421 for connection to the load through connector 1421. Connector 1422 is automatically shorted when connector 1422 is unplugged.

In one embodiment, the same connector carries both the series and the parallel connections. Solar panel assemblies that do not have an inverter built in simply pass the parallel connection through themselves.

The US national electrical code (NEC) requires solar panels to have a "continuous ground." Many inspectors interpret this as the need for an uncut ground wire to go from the electrical panel or a ground rod to each of the solar panels (usually a single wire snaking uncut from panel to panel through the entire group). In one embodiment, the wire that goes from the set of solar panel assemblies to the electrical panel includes a ground wire that emerges from the connector that attaches to the solar panels. This ground wire is long enough to snake around all of the solar panel assemblies, each of which it is attached to.

For fire safety it is desirable that the solar panels be easily removable. In one embodiment, the electrical cables are breakaway, in that the panel assemblies' electrical cables will break their connection if pulled apart.

In one embodiment, the ground wire will release from a solar panel assembly when pulled with enough force. In one embodiment, this is implemented by using a washer of a soft metal that is compatible with electrical wiring (e.g. copper) to hold the wire to the panel.

Practical Mechanical Configurations

Figure 15:
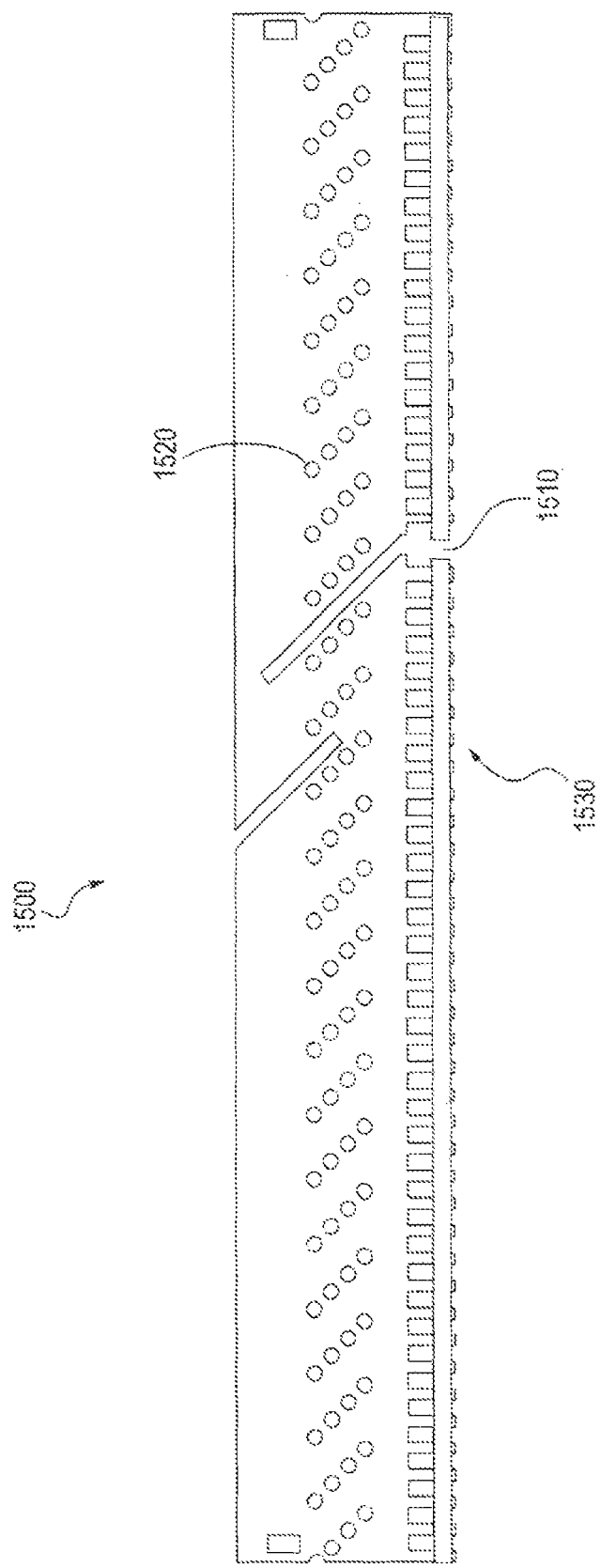
FIG. 15 illustrates an exemplary mounting bracket, according to one embodiment.

FIG. 15 illustrates an exemplary mounting bracket, according to one embodiment. Mounting bracket 1500 is a roof-mounted bracket that accommodates expansion and contraction of the roof. Mounting bracket 1500 includes expansion breaks 1510.

To make it easier to attach to the rafters on the roof, the screw holes 1520 may be marked for easy periodic installation. Examples include but are not limited to installation of a screw or screws every 16 inches or 24 inches to match rafter spacing. In one embodiment, screw holes 1520 are physically laid out in a geometrically repeating pattern or a non-repeating pattern to make the needed periodic installation easier.

Using such an arrangement, once one rafter is located all subsequent rafters can be located simply by placing subsequent screws in the right place. For example if rafters are on 16 inch centers, and a screw placed in the third hole down entered a rafter, a screw in the third hole down in a group that is four groups to the right should also hit a rafter.

In one embodiment, an installation process involves:
 a. Driving a screw into the hole that is likely to hit a rafter. This may be based on the measurement of the distance from a previous screw that hit a rafter, or by using a joist detector, or any other methodology.
 b. Driving screws into the two adjacent holes This process guarantees that at least one of the three screws in each group will hit the rafter as long as the rafters meet the target spacing (16 inch or 24 inch on center) within a tolerance of 1.5 inches. (Typical construction tolerances are ¼" for rough framing like rafters).

Mounting bracket 1500 also includes slots 1530 to avoid having water or ice pool behind the bracket 1500. Slots 1530 allow water to filter through bracket 1500.

Figure 16:
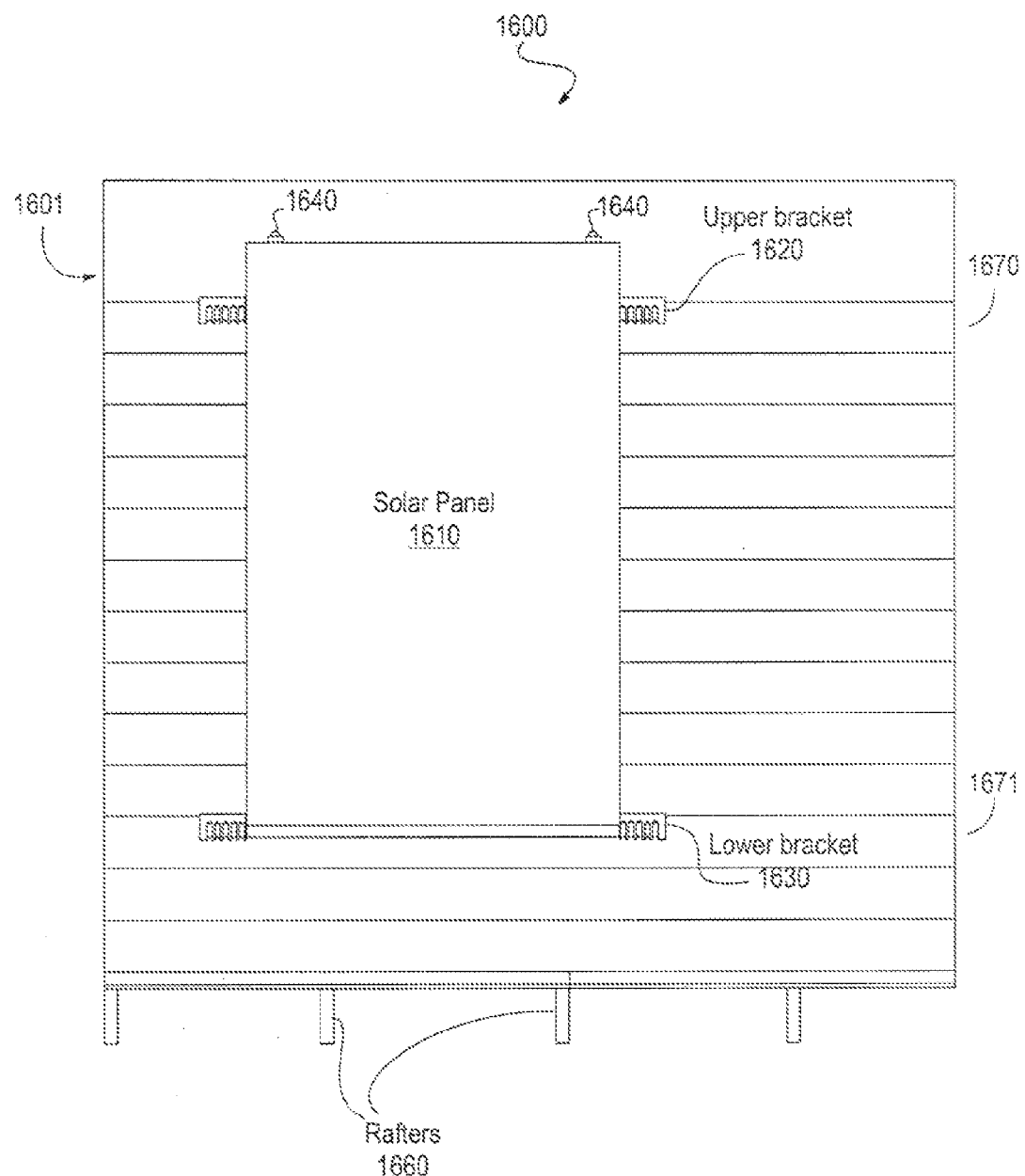
FIG. 16 illustrates an exemplary solar panel system installed on a roof, according to one embodiment.

FIG. 16 illustrates an exemplary solar system installed on a roof, according to a preferred embodiment. Solar system 1600 has a solar panel assembly 1610 mounted on roof 1601. Solar panel assembly 1610 is attached to roof 1601 using upper bracket 1620 and lower bracket 1630. The brackets 1620, 1630 are installed in between rows of shingles. Solar panel assembly 1610 includes electrical connectors 1640. Brackets 1620, 1630 are connected to rafters 1660.

FIG. 17 illustrates an exemplary solar panel installation using a lower bracket, according to one embodiment. Solar panel assembly 1700 has solar panel 1710 attached to lower bracket 1720. Bracket 1720 is attached to the roof and installed between rows of shingles 1730 and 1740 such that the bracket-to-roof fasteners are concealed and protected under the row of shingles 1740. Solar panel 1710 has bracket connection mechanism 1750 that has fingers 1751 that grab the bracket 1720 as the solar panel 1710 is rotated into place.

Figure 18A:
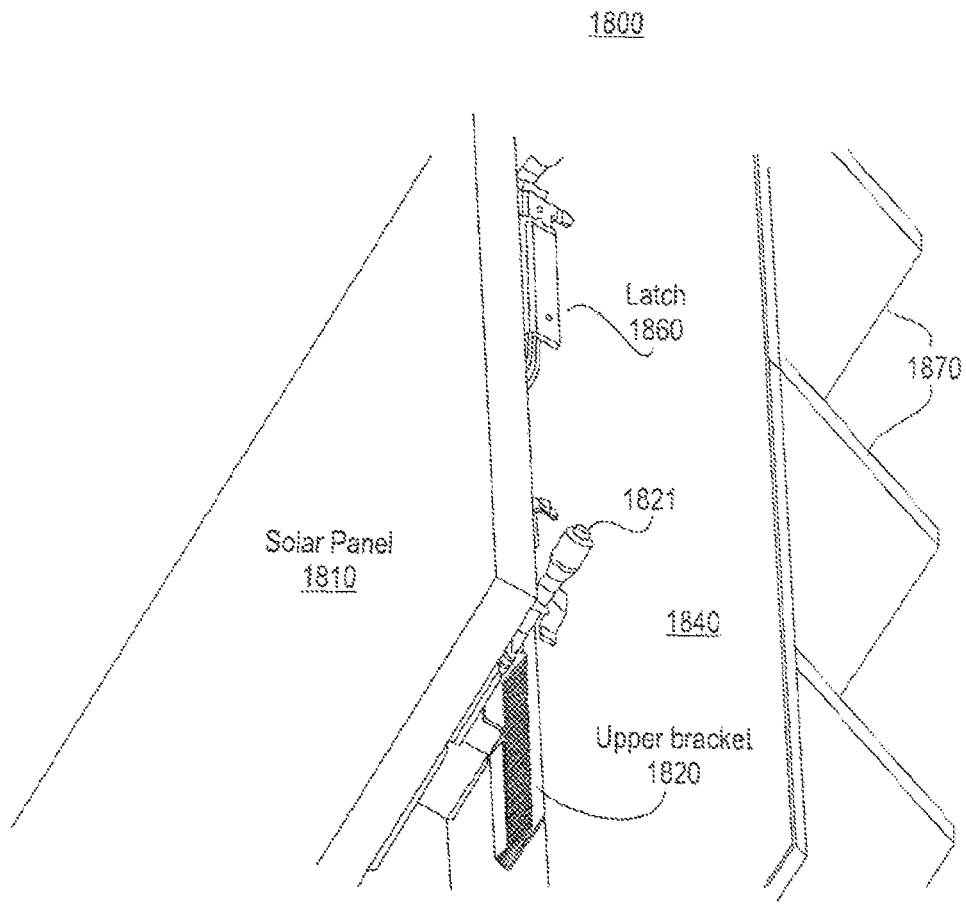
FIG. 18A illustrates an exemplary solar panel installation using a top bracket and latch, according to one embodiment.

FIG. 18A illustrates an exemplary solar panel installation using a top bracket and latch, according to one embodiment. Solar panel assembly 1800 has a solar panel 1810 attached to upper bracket 1820 using latch mechanism 1860. Solar panel assembly 1800 also has an electrical connector 1821 that may be a plug and socket as described above. Upper bracket 1820 is attached to the rafters 1870 using fasteners that are covered by a row of shingles 1840. Latch mechanism 1860 is a quick release mechanism as described above. Latch mechanism 1860 allows for firefighters to quickly remove solar panel 1810 in case of an emergency without risk of electrocution. Latch mechanism 1860 is easily identifiable with a bright color to aid rescue workers.

Figure 18B:
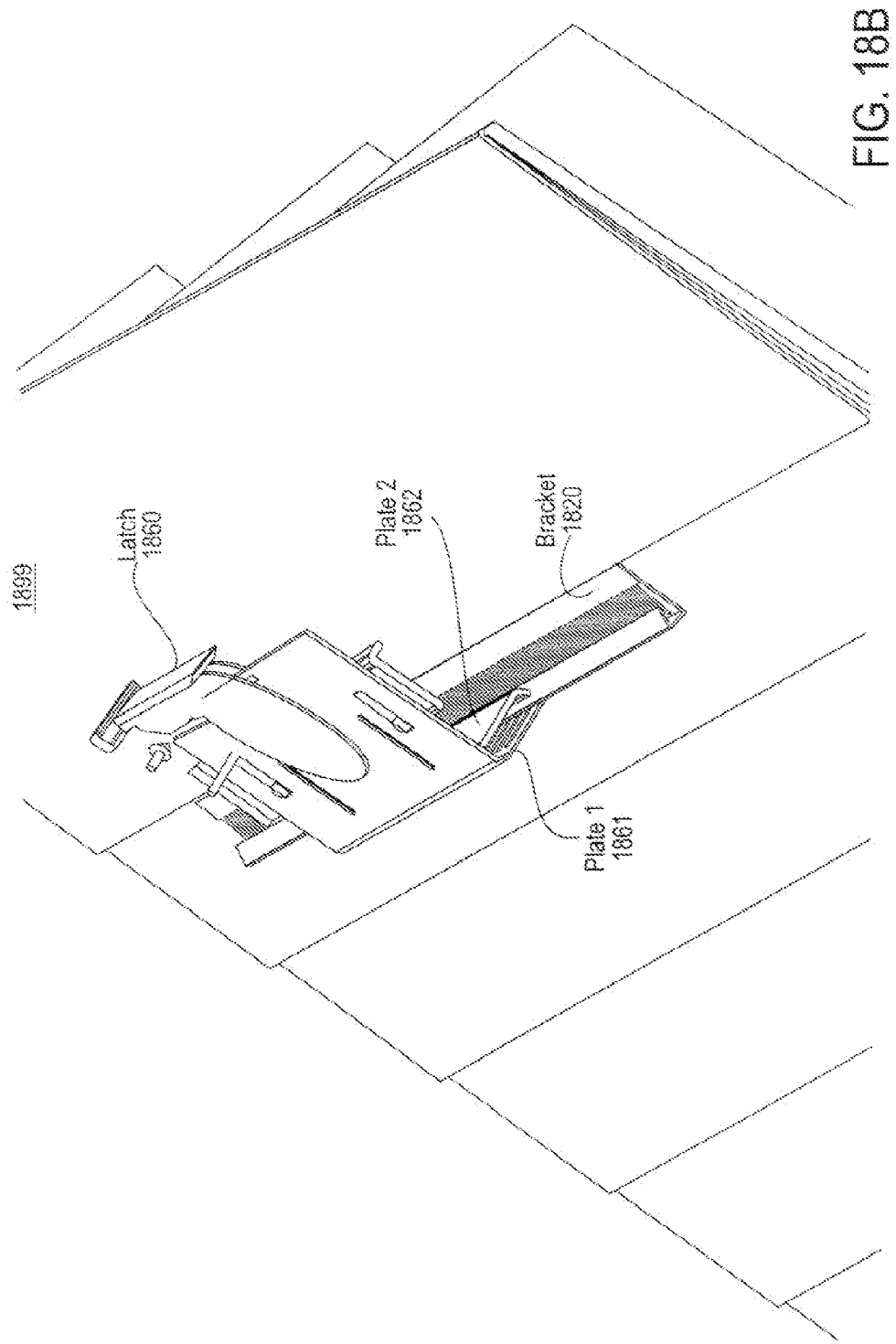
FIG. 18B illustrates an exemplary latch mechanism attached to an upper bracket, according to one embodiment.

FIG. 18B illustrates an exemplary latch mechanism attached to an upper bracket, according to one embodiment. Latch assembly 1899 illustrates solar panel assembly without the solar panel and other items that obscure the latch mechanism 1860. Latch mechanism 1860 has plate 1861 and plate 1862 that attach to bracket 1820. Plate 1862 has a lip that mates with the lip of bracket 1820 to lock solar panel 1810 securely in place.

Figure 19:
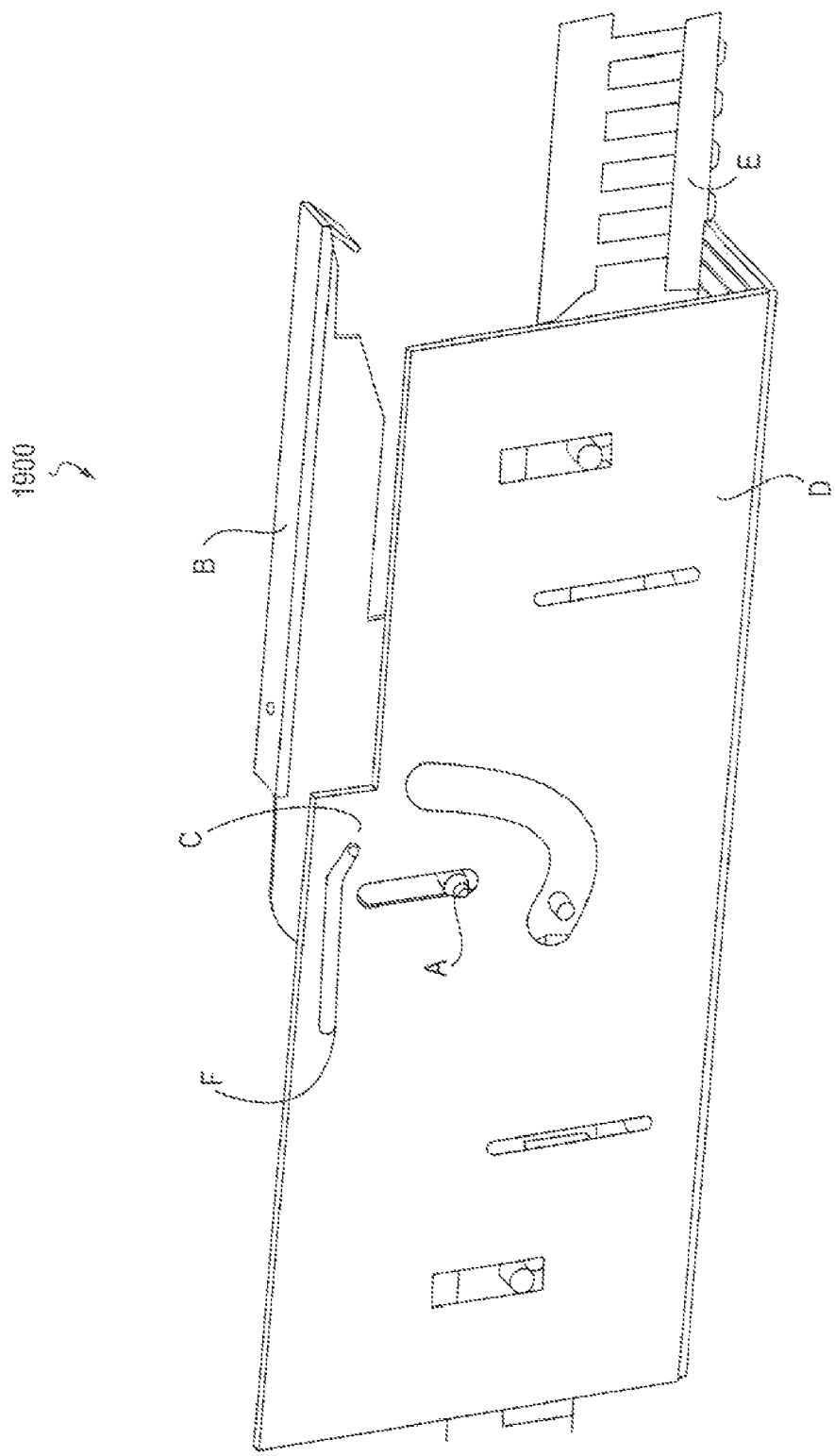
FIG. 19 illustrates an exemplary plate of a latch mechanism, according to one embodiment.

FIG. 19 illustrates an exemplary plate of a latch mechanism, according to one embodiment. Details of the actuation of plates 1861 are shown. Referring plate and bracket assembly 1900, latch B pivots on pin A, which is rigidly attached to the solar panel through a bracket that is not shown. Rotating latch B moves pin C through an arc within slot F in the plate D. The arc-shaped motion causes plate D to move forward and backward (up and down in the illustration), allowing grasping and releasing of roof bracket E. Plate 1862 is actuated in a similar manner in the opposite direction.

The aforementioned latch system accommodates:
 a. The roof not being co-planar at the top and bottom bracket.
 b. Brackets that are not set perfectly parallel.
 c. Shingles that have different exposure. Two exposure distances are in common use: 5" and 5⅝" between rows Automatic Transfer Switch System Grid-tied photovoltaic solar systems are required by electrical safety regulations to discontinue generation of electrical power when grid power is not available. This is to avoid injection of electricity into wires that electric company repairmen would expect to be unpowered.

During a daytime power failure it is desirable to utilize the electricity generated by the domestic solar system. Generators that are wired into the house introduce the same safety problems that solar power during a blackout would. These generators are required to be connected to the house using a transfer switch that disconnects house loads from electricity from the utility company to electricity generated by the generator.

Prior transfer switches are available as manual devices or as automatic devices (that automatically switch during a power failure). They are all bulky and relatively expensive to install.

Often the desired load is a subset of the full house load. For example, the refrigerator, well head, and sump pump may be connected to the generator while the air conditioner, water heater, etc. are not. Rewiring of the house electrical panel with the possibility of an entire new electrical panel may be required to achieve this.

Load transfer of solar power that does not include battery backup is more complicated. Without battery backup, the solar system is limited in instantaneous output to whatever power is generated at the moment. The number of loads that can be handled changes from moment to moment.

Figure 20:
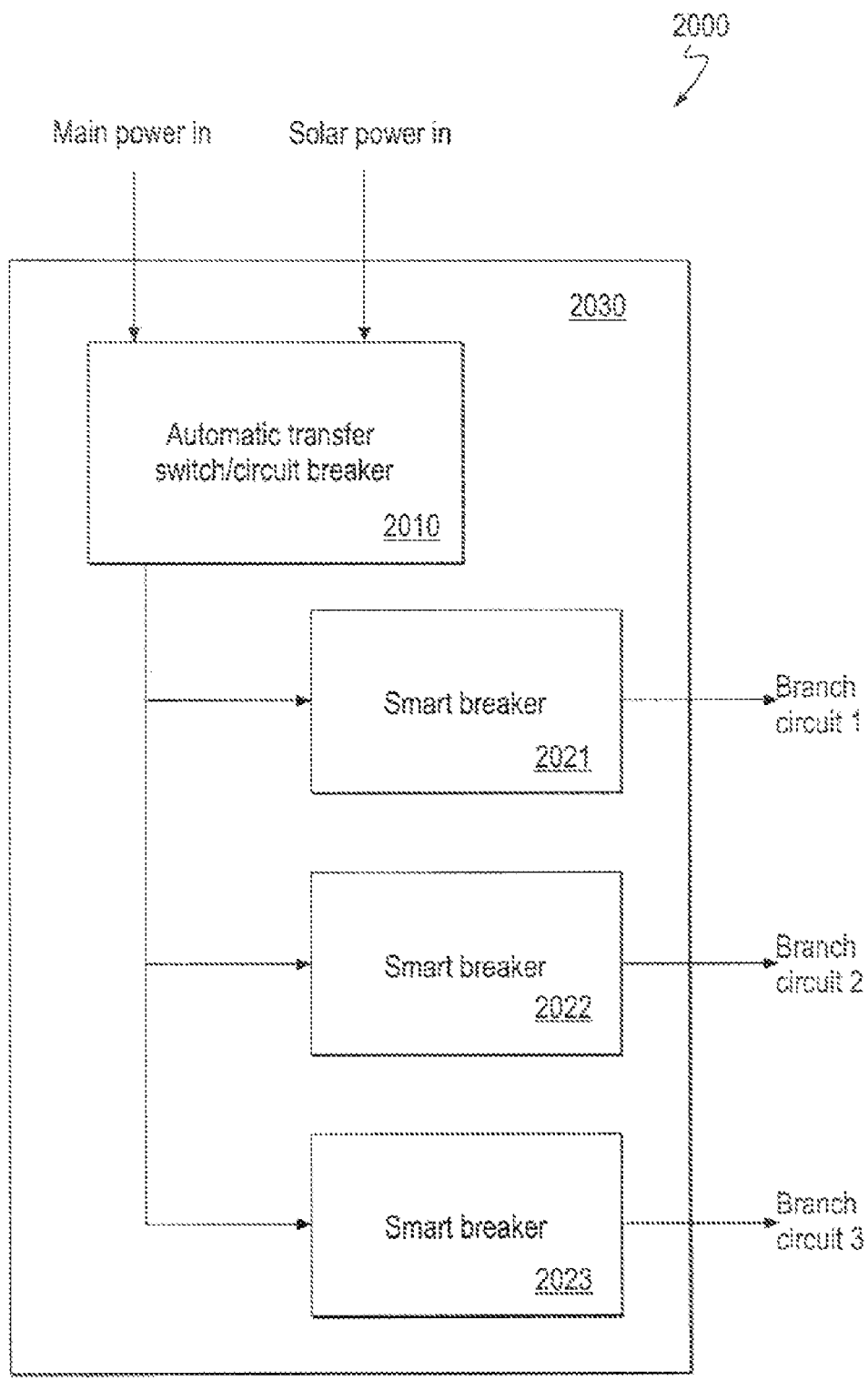
FIG. 20 illustrates an exemplary automatic power transfer system, according to one embodiment.

FIG. 20 illustrates an exemplary automatic power transfer system, according to one embodiment. Power transfer system 2000 may be incorporated into a standard home electrical panel 2030 having main power and solar power inputs. Power transfer system 2000 has an automatic transfer switch 2010 that switches between the main power and solar power inputs. Automatic transfer switch 2010 may also include a circuit breaker. Power transfer system 2000 has:
 a. An automatic transfer switch 2010 In a preferred embodiment it is form and function compatible with the main circuit breaker module in the electrical panel, requiring an electrician to merely switch out the original circuit breaker to this new circuit breaker.
 b. Smart circuit breakers 2021-2023. These circuit breakers include a communication path to the automatic transfer switch 2010. During times of normal power, they operate as prior circuit breakers, providing electricity to their load until and unless overcurrent is detected. During transfer to solar power, they would operate intelligently using control software. In a preferred embodiment smart circuit breakers 2021-2023 have the form, fit, and function of standard circuit breakers, allowing installation by the electrician merely by switching out standard circuit breakers for these special circuit breakers.
 c. Control software. This software controls the smart circuit breakers 2021-2023. It includes priority settings (e.g. first priority is to the sump pump, second priority to the well-head, third priority to the refrigerator), through which it chooses which circuit breakers to turn on and off. The smart circuit breakers 2021-2023 may include a current measurement function in which they measure needed power for their branch circuit, and the solar panels may include a current measurement function in which it measures available power. This control software would utilize this information to optimize operation. (e.g. if the sump pump is first priority, but there is not adequate power for it, redirect power to the refrigerator, for which there is enough power).

The control software may include more sophisticated priority settings. For example certain kinds of loads do not respond well to quick power cycling (refrigerators and air conditioners). Other types of loads may have high priority for a total amount of time, but low priority to be on at any given moment (refrigerators fall into this category—they will keep their contents cold as long as they receive power 30% of the time, but which 30% of the time is arbitrary).

Energy Monitor System

In one embodiment the present solar system has a wall-mounted energy monitor display. Getting power and data to existing systems requires expensive electrical retrofit work that it would be desirable to avoid.

In one embodiment the energy monitor uses wireless data (e.g. zigbee or Wifi) and battery power. In one embodiment, adequate battery life is achieved by using a display that only requires power during display changes (e.g. bistable displays), or by using a touchscreen, motion detector, or other proximity detector to enable the display. When the display is off, the wireless data service may also be off.

In one embodiment, a display that only uses power when the display changes is combined with a proximity detector. In this embodiment, the display shows information that requires infrequent refreshes (such as monthly power savings) when there is no proximity, and shows real-time data updates when there is proximity.

The sensor/control unit receives and displays data from the solar system and/or from an internet-based data source, which may include data such as electric rates, weather, etc. In one embodiment, fusing and processing of data from the solar system and the internet-based data source occurs within the home, eg. in the sensor/control unit. In one embodiment fusing and processing of data is performed remotely at a processing resource located on the Internet.

Software System

According to one embodiment, software aids installation of the present solar system. This software may include a web-based application to show an animation of where the sun is over the course of a day and how the shadows move on the roof of the house of interest.

Data for this application may be from a combination of satellite images (including images from straight above, as well as from the south, west, and east), as well as direct measurements of heights of items on the ground from distance sensing satellites (using LIDAR).

In one embodiment, data from Google street view or other similar mechanism is used to determine heights of trees and other shadow-generating obstructions.

In one embodiment, image processing algorithms determine the location of pipes and other obstructions on the roof which will determine possible placement of solar panels.

In one embodiment, the placement of the panels is automatically determined by analyzing shadow data combined with pipes and other obstructions on the roof.

In one embodiment, the data is automatically fed into modules that generate a solar system quote, as well as automatically generating a building permit application for the local community (layout of building permit may be database-driven for the local community), as well as rebate application and interconnect agreement (which may also be database driven for format).

Packaging for Site Delivery

The present packaging is related to novel features and mechanisms for packaging and delivery of roof-mounted solar electricity generation systems and components, which include, but are not limited to, photovoltaic panels and concentrating photovoltaics, to the roof via conveyor belt, forklift, or lift truck, which are common methods for delivery of robust roofing materials such as nails and shingles.

Building mounted solar electricity generation (solar) is greatly desired both by property owners and for the overall public good created by clean, renewable solar power. There are many challenges associated with mounting solar on a building. One challenge relates to the ability to deliver the components and systems to the areas where the solar is being physically mounted, using tools and methods for delivery of less delicate materials, such as shingles and nails, without fear of loss due to breakage.

In most residential solar installations, the system components, commonly solar panels or solar panel assemblies, are deliver to the site in one of two ways—they are either delivered by courier to site address and placed on the ground by the courier, requiring the installation crew to manually move the components to the roof, or they are delivered to the site address by the installer and then either manually moved to the roof or placed on the roof with a crane. A less common method for delivery of solar systems and components is the use of a portable conveyor belt system, because it is associated with rough handling and can easily result in the breakage of expensive components due to the fact that the packaging materials and methods in current use are designed for delivery by courier. However, the conveyor belt delivery system is growing in usage as the market for rooftop solar increases.

Thus new methods of packaging photovoltaic panels specifically designed to use conveyor belt delivery systems are desired and needed.

In one embodiment, two or more solar panels or solar panel assemblies are packaged together in such a way that the weight of the package does not exceed 125 pounds for transport on the conveyor belt. Preferably, the weight of the package does not exceed 100 pounds. Most preferably, the weight of the package does not exceed 75 pounds.

In one embodiment, two solar panels or solar panel assemblies are packaged such that the faces of the panels exposed to the sun under operating conditions (the upward face), for both panels, are facing each other. In another embodiment, the downward faces (the opposite side from the upward face) are facing each other. In another embodiment, the panels all face the same direction such that the upward face of one panel faces the downward face of the next.

In one embodiment, a box can contain two or more solar panels or solar panel assemblies. Preferably the box has a hinged lid. Alternately lid may be completely detachable. In either embodiment, the lid can be locked in place such that it can only be opened with special tools, keys, code or combination.

In one embodiment, the box is no more than 52 inches wide in one dimension parallel to the opening upon removal of the lid. More preferably it is no longer than 48 inches in said dimension.

In one embodiment, the solar panels or solar panel assemblies are inserted such that they lie in a plane parallel to the opening formed upon removal of the lid. Preferably, in this case, the solar panels or solar panel assemblies lie in a plane In one embodiment, corner blocks are attached to the solar panels or solar panel assemblies to allow rougher handling than would otherwise be possible. These blocks may be made of expanded foam type materials such as polysterene, or may be made of cellulose based materials, such as cardboard. These corner blocks may be attached with adhesive tapes, straps, sleeves, or any other method that guarantees secure attachment of the corner blocks. These corner blocks may be internal or external to a box or other wrapping or shipping materials.

In one embodiment, a delivery process involves:
a. Placing solar panels or solar panel assemblies onto a conveyer belt at ground level
b. Using the conveyer belt to carry the solar panel or solar panel assemblies to the roof
c. Unloading the solar panels or solar panel assemblies from the conveyer belt onto the roof While particular embodiments and applications have been illustrated and described herein, it is to be understood that the invention is not limited to the precise construction and components disclosed herein and that various modifications, changes, and variations may be made in the arrangement, operation, and details of the methods and apparatuses of the present embodiments without departing from the spirit and scope of the invention.

What is claimed is:

1. A solar panel mounting system, the system comprising:
a bracket affixed to a surface for mounting a solar panel, wherein the bracket receives at least one solar panel; and
a latch mechanism attached to the solar panel, the latch mechanism including a locking apparatus that secures the solar panel in the bracket and at least one handle that moves between a locked position and an open position, the latch mechanism securing the solar panel in the bracket with the locking apparatus engaging the bracket when the handle is in the locked position, the solar panel being removable when the handle is in the open position.

2. The solar panel system of claim 1, wherein the latch mechanism further includes a first plate and a second plate that contact opposite sides of a protrusion of the bracket when the handle is in the locked position, and secure the solar panel in the bracket.

3. The solar panel system of claim 1, wherein the latch mechanism further includes a first plate and a second plate that contact opposite sides of a protrusion of the bracket when the latch mechanism is actuated and secure the solar panel in the bracket.

4. The solar panel system of claim 1, wherein the solar panel includes wiring that is disconnected when the latch mechanism is disengaged.

5. The solar panel system of claim 1, wherein the solar panel further includes wiring that is disengaged by actuation of a release mechanism.

6. The solar panel system of claim 1, wherein the solar panel includes wiring having a break-away connection, the break-away connection positioned on an underside of the solar panel.

7. The solar panel system of claim 1, wherein the solar panel includes wiring that is disconnected by disengaging the solar panel from an installed position in the bracket.

8. The solar panel system of claim 1, further comprising a release handle that deforms the locking apparatus when actuated so as to release the solar panel from the bracket.

9. The solar panel system of claim 1, wherein the solar panel includes wiring, the latch mechanism severing the wiring when the latch mechanism is released.

10. The solar panel system of claim 1, wherein the solar panel is manually mounted in the bracket.

11. The solar panel system of claim 1, wherein the solar panel is mounted without tools.

12. The solar panel system of claim 1, wherein the latch mechanism is manually actuated.

13. The solar panel system of claim 1, wherein the latch mechanism is actuated without tools.

14. The solar panel system of claim 1, wherein the handle is moved manually between the locked position and the open position.

15. The solar panel system of claim 1, wherein the handle is moved without tools.

16. The solar panel system of claim 1, wherein when the handle is in the open position, the solar panel is manually removable.

17. The solar panel system of claim 1, wherein when the handle is in the open position, the solar panel is removable without tools.

18. A solar panel mounting system, the system comprising:
a bracket affixed to a surface for mounting a solar panel, wherein the bracket receives at least one solar panel; and
a latch mechanism attached to the solar panel, the latch mechanism including a locking apparatus that secures the solar panel in the bracket, at least one handle that moves between a locked position and an open position, and a first plate and a second plate that contact opposite sides of a protrusion of the bracket when the handle is in the locked position and secure the solar panel in the bracket, the latch mechanism securing the solar panel in the bracket when the handle is in the locked position, the solar panel being removable when the handle is in the open position.

19. The solar panel system of claim 18, wherein the locking apparatus engages the bracket when the handle is in the locked position.

20. The solar panel system of claim 18, wherein the latch mechanism further includes a first plate and a second plate that contact opposite sides of a protrusion of the bracket when the latch mechanism is actuated and secure the solar panel in the bracket.

21. The solar panel system of claim 18, wherein the solar panel includes wiring that is disconnected when the latch mechanism is disengaged.

22. The solar panel system of claim 18, wherein the solar panel further includes wiring that is disengaged by actuation of a release mechanism.

23. The solar panel system of claim 18, wherein the solar panel includes wiring having a break-away connection, the break-away connection positioned on an underside of the solar panel.

24. The solar panel system of claim 18, wherein the solar panel includes wiring that is disconnected by disengaging the solar panel from an installed position in the bracket.

25. The solar panel system of claim 18, further comprising a release handle that deforms the locking apparatus when actuated so as to release the solar panel from the bracket.

26. The solar panel system of claim 18, wherein the solar panel includes wiring, the latch mechanism severing the wiring when the latch mechanism is released.

27. The solar panel system of claim 18, wherein the solar panel is manually mounted in the bracket.

28. The solar panel system of claim 18, wherein the solar panel is mounted without tools.

29. The solar panel system of claim 18, wherein the latch mechanism is manually actuated.

30. The solar panel system of claim 18, wherein the latch mechanism is actuated without tools.

31. The solar panel system of claim 18, wherein the handle is moved manually between the locked position and the open position.

32. The solar panel system of claim 18, wherein the handle is moved without tools.

33. The solar panel system of claim 28, wherein when the handle is in the open position, the solar panel is manually removable.

34. The solar panel system of claim 28, wherein when the handle is in the open position, the solar panel is removable without tools.

35. A solar panel mounting system, the system comprising:
a bracket affixed to a surface for mounting a solar panel, wherein the bracket receives at least one solar panel; and
a latch mechanism attached to the solar panel, the latch mechanism including a locking apparatus that secures the solar panel in the bracket, the latch mechanism including a first plate and a second plate that contact opposite sides of a protrusion of the bracket when the latch mechanism is actuated and secure the solar panel in the bracket.

36. The solar panel system of claim 35, wherein the latch mechanism further includes at least one handle that moves between a locked position and an open position, the latch mechanism securing the solar panel in the bracket when the handle is in the locked position, the solar panel being removable when the handle is in the open position.

37. The solar panel system of claim 36, wherein the locking apparatus engages the bracket when the handle is in the locked position.

38. The solar panel system of claim 36, wherein the latch mechanism further includes a first plate and a second plate that contact opposite sides of a protrusion of the bracket when the handle is in the locked position, and secure the solar panel in the bracket.

39. The solar panel system of claim 35, wherein the solar panel includes wiring that is disconnected when the latch mechanism is disengaged.

40. The solar panel system of claim 35, wherein the solar panel further includes wiring that is disengaged by actuation of a release mechanism.

41. The solar panel system of claim 35, wherein the solar panel includes wiring having a break-away connection, the break-away connection positioned on an underside of the solar panel.

42. The solar panel system of claim 35, wherein the solar panel includes wiring that is disconnected by disengaging the solar panel from an installed position in the bracket.

43. The solar panel system of claim 35, further comprising a release handle that deforms the locking apparatus when actuated so as to release the solar panel from the bracket.

44. The solar panel system of claim 35, wherein the solar panel includes wiring, the latch mechanism severing the wiring when the latch mechanism is released.

45. The solar panel system of claim 35, wherein the solar panel is manually mounted in the bracket.

46. The solar panel system of claim 35, wherein the solar panel is mounted without tools.

47. The solar panel system of claim 35, wherein the latch mechanism is manually actuated.

48. The solar panel system of claim 35, wherein the latch mechanism is actuated without tools.

49. The solar panel system of claim 36, wherein the handle is moved manually between the locked position and the open position.

50. The solar panel system of claim 36, wherein the handle is moved without tools.

51. The solar panel system of claim 36, wherein when the handle is in the open position, the solar panel is manually removable.

52. The solar panel system of claim 36, wherein when the handle is in the open position, the solar panel is removable without tools.

* * * * *